(12) United States Patent
Chen et al.

(10) Patent No.: US 11,114,549 B2
(45) Date of Patent: Sep. 7, 2021

(54) SEMICONDUCTOR STRUCTURE CUTTING PROCESS AND STRUCTURES FORMED THEREBY

(71) Applicant: Taiwan Semiconductor Manufacturing Co., Ltd., Hsinchu (TW)

(72) Inventors: Ryan Chia-Jen Chen, Chiayi (TW); Ming-Ching Chang, Hsinchu (TW); Yi-Chun Chen, Hsinchu (TW); Yu-Hsien Lin, Kaohsiung (TW); Li-Wei Yin, Hsinchu (TW); Tzu-Wen Pan, Hsinchu (TW); Cheng-Chung Chang, Kaohsiung (TW); Shao-Hua Hsu, Taitung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 139 days.

(21) Appl. No.: 15/909,800

(22) Filed: Mar. 1, 2018

(65) Prior Publication Data

US 2019/0165137 A1 May 30, 2019

Related U.S. Application Data

(60) Provisional application No. 62/591,905, filed on Nov. 29, 2017.

(51) Int. Cl.
*H01L 29/66* (2006.01)
*H01L 29/78* (2006.01)
(Continued)

(52) U.S. Cl.
CPC .......... *H01L 29/66795* (2013.01); *H01L 21/823821* (2013.01); *H01L 27/0924* (2013.01);
(Continued)

(58) Field of Classification Search
CPC ....... H01L 29/66795; H01L 21/823821; H01L 27/0924; H01L 29/1054; H01L 29/785; H01L 21/845
See application file for complete search history.

(56) References Cited

U.S. PATENT DOCUMENTS 8,962,400 B2   2/2015   Tsai et al.
9,093,514 B2   7/2015   Tsai et al.
(Continued)

FOREIGN PATENT DOCUMENTS

CN   106057671 A   10/2016
CN   106206308 A   12/2016
(Continued)

*Primary Examiner* — Allen L Parker
*Assistant Examiner* — Charles N Ausar-El
(74) *Attorney, Agent, or Firm* — Slater Matsil, LLP

(57) ABSTRACT

Methods of cutting fins, and structures formed thereby, are described. In an embodiment, a structure includes a first fin and a second fin on a substrate, and a fin cut-fill structure disposed between the first fin and the second fin. The first fin and the second fin are longitudinally aligned. The fin cut-fill structure includes a liner on a first sidewall of the first fin, and an insulating fill material on a sidewall of the liner and on a second sidewall of the first fin. The liner is further on a surface of the first fin between the first sidewall of the first fin and the second sidewall of the first fin.

20 Claims, 50 Drawing Sheets

(51) Int. Cl.
*H01L 29/10* (2006.01)
*H01L 21/8238* (2006.01)
*H01L 27/092* (2006.01)
*H01L 21/84* (2006.01)
*H01L 27/12* (2006.01)

(52) U.S. Cl.
CPC ........ *H01L 29/1054* (2013.01); *H01L 29/785* (2013.01); *H01L 21/845* (2013.01); *H01L 27/1211* (2013.01)

(56) References Cited

U.S. PATENT DOCUMENTS

| | | | |
|---|---|---|---|
| 9,093,530 B2 | 7/2015 | Huang et al. | |
| 9,166,024 B2 * | 10/2015 | Hung | H01L 29/66795 |
| 9,171,929 B2 | 10/2015 | Lee et al. | |
| 9,190,487 B2 * | 11/2015 | Khakifirooz | H01L 29/66545 |
| 9,214,555 B2 | 12/2015 | Oxland et al. | |
| 9,236,267 B2 | 1/2016 | De et al. | |
| 9,245,805 B2 | 1/2016 | Yeh et al. | |
| 9,418,897 B1 | 8/2016 | Ching et al. | |
| 9,520,482 B1 | 12/2016 | Chang et al. | |
| 9,548,303 B2 | 1/2017 | Lee et al. | |
| 9,564,489 B2 | 2/2017 | Yeo et al. | |
| 9,576,814 B2 | 2/2017 | Wu et al. | |
| 9,601,342 B2 | 3/2017 | Lee et al. | |
| 9,608,062 B1 * | 3/2017 | Tseng | H01L 29/0653 |
| 9,608,086 B2 * | 3/2017 | Wei | H01L 29/66545 |
| 9,608,116 B2 | 3/2017 | Ching et al. | |
| 9,679,985 B1 * | 6/2017 | Wu | H01L 29/4991 |
| 9,704,973 B2 * | 7/2017 | Xie | H01L 29/66818 |
| 9,721,848 B1 | 8/2017 | Bu et al. | |
| 9,805,983 B1 * | 10/2017 | Cheng | H01L 21/823475 |
| 9,812,363 B1 | 11/2017 | Liao et al. | |
| 9,812,365 B1 * | 11/2017 | Zhang | H01L 29/66545 |
| 9,818,836 B1 * | 11/2017 | Sung | H01L 29/513 |
| 9,818,875 B1 | 11/2017 | Bi et al. | |
| 9,859,380 B2 | 1/2018 | Lee et al. | |
| 9,929,157 B1 * | 3/2018 | Xie | H01L 27/0886 |
| 10,083,874 B1 * | 9/2018 | Yu | H01L 21/3065 |
| 10,083,961 B2 * | 9/2018 | Bergendahl | H01L 21/823821 |
| 10,090,402 B1 * | 10/2018 | Park | H01L 29/66795 |
| 10,229,854 B1 * | 3/2019 | Sporre | H01L 27/0886 |
| 10,236,213 B1 * | 3/2019 | Pandey | H01L 21/823437 |
| 10,269,787 B2 * | 4/2019 | Wang | H01L 29/42372 |
| 10,325,912 B2 * | 6/2019 | Chen | H01L 21/32133 |
| 10,366,930 B1 * | 7/2019 | Xie | H01L 21/823431 |
| 10,373,873 B1 * | 8/2019 | Park | H01L 21/823418 |
| 10,373,877 B1 * | 8/2019 | Wang | H01L 21/823821 |
| 2009/0017630 A1 | 1/2009 | Lee et al. | |
| 2014/0061820 A1 * | 3/2014 | Reznicek | H01L 21/823821 257/401 |
| 2014/0227848 A1 * | 8/2014 | Kang | H01L 21/823431 438/283 |
| 2014/0291770 A1 * | 10/2014 | Yin | H01L 21/823821 257/397 |
| 2015/0035086 A1 * | 2/2015 | Xie | H01L 29/66545 257/411 |
| 2015/0060959 A1 | 3/2015 | Lin et al. | |
| 2015/0325588 A1 * | 11/2015 | Lee | H01L 27/11573 257/329 |
| 2016/0155824 A1 | 6/2016 | Lin et al. | |
| 2017/0018437 A1 * | 1/2017 | Greene | H01L 29/66545 |
| 2017/0062590 A1 * | 3/2017 | Cheng | H01L 21/31 |
| 2017/0092643 A1 * | 3/2017 | Tseng et al. | |
| 2017/0170176 A1 | 6/2017 | Jagannathan et al. | |
| 2017/0243790 A1 * | 8/2017 | Xie | H01L 21/823431 |
| 2018/0069000 A1 * | 3/2018 | Bergendahl | H01L 27/0886 |
| 2018/0269306 A1 * | 9/2018 | Bao | H01L 29/0847 |
| 2019/0067115 A1 * | 2/2019 | Park | H01L 21/823437 |
| 2019/0131298 A1 * | 5/2019 | Chen | H01L 29/66545 |
| 2019/0164844 A1 * | 5/2019 | Huang | H01L 21/02181 |
| 2019/0165137 A1 * | 5/2019 | Chen | H01L 29/66795 |
| 2019/0267374 A1 * | 8/2019 | Hung | H01L 29/49 |
| 2019/0273149 A1 * | 9/2019 | Huang | H01L 21/82345 |
| 2019/0319112 A1 * | 10/2019 | Zang | H01L 29/66545 |
| 2019/0341475 A1 * | 11/2019 | Shu | H01L 29/6656 |

FOREIGN PATENT DOCUMENTS

| | | |
|---|---|---|
| CN | 106206314 A | 12/2016 |
| CN | 106328705 A | 1/2017 |
| CN | 106711213 A | 5/2017 |
| KR | 20090007523 A | 1/2009 |
| KR | 20160038673 A | 4/2016 |

* cited by examiner

SEMICONDUCTOR STRUCTURE CUTTING PROCESS AND STRUCTURES FORMED THEREBY

PRIORITY CLAIM AND CROSS-REFERENCE

This application claims the benefit of and priority to U.S. Provisional Patent Application Ser. No. 62/591,905, filed on Nov. 29, 2017, entitled "Semiconductor Structure Cutting Process and Structures Formed Thereby," which is incorporated herein by reference in its entirety.

BACKGROUND

As the semiconductor industry has progressed into nanometer technology process nodes in pursuit of higher device density, higher performance, and lower costs, challenges from both fabrication and design issues have resulted in the development of three-dimensional designs, such as a Fin Field Effect Transistor (FinFET). FinFET devices typically include semiconductor fins with high aspect ratios and in which channel and source/drain regions are formed. A gate is formed over and along the sides of the fin structure (e.g., wrapping) utilizing the advantage of the increased surface area of the channel to produce faster, more reliable, and better-controlled semiconductor transistor devices. In some devices, strained materials in source/drain regions of the FinFET utilizing, for example, silicon germanium (SiGe), silicon carbide (SiC), and/or silicon phosphide (SiP) may be used to enhance carrier mobility.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
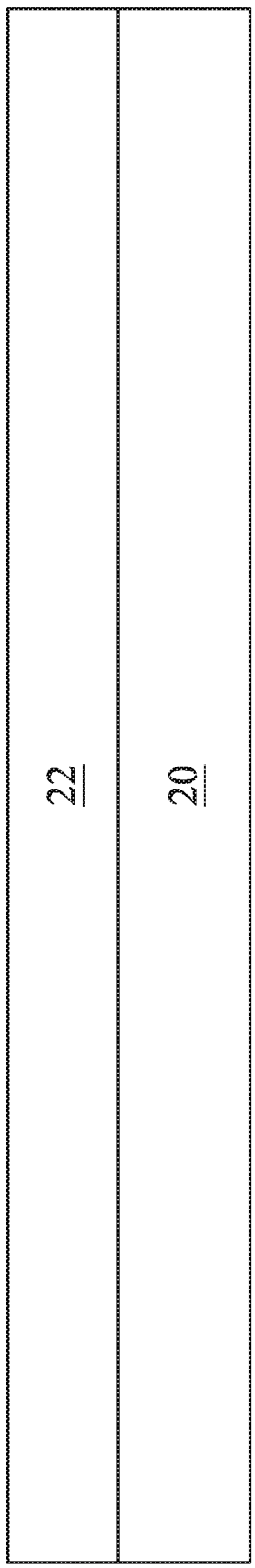
FIGS. 1, 2, 3A-B, 4A-D, 5A-C, 6A-C, 7A-C, 8A-C, 9A-C, 10A-C, 11A-C, 12A-C, 13A-C, 14A-C, 15A-C, 16A-C, 17A-C and 18A-C are various views of respective intermediate structures at intermediate stages in an example process of forming a semiconductor device including one or more FinFETs in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Methods of cutting fins in a semiconductor device, such as including Fin Field-Effect Transistors (FinFETs), are described herein. Generally, a fin cut process is performed after a replacement gate structure has been formed and cut. The fin cut process can include trimming a fin and forming a liner on sidewalls of the fin where the fin was trimmed. With the liner formed, the fin is cut. This can, among other benefits, increase a process window for some processes and, in some stress engineering applications, avoid releasing or relaxing stress in a fin.

Example embodiments described herein are described in the context of FinFETs. Implementations of some aspects of the present disclosure may be used in other processes and/or in other devices. Some variations of the example methods and structures are described. A person having ordinary skill in the art will readily understand other modifications that may be made that are contemplated within the scope of other embodiments. Although method embodiments may be described in a particular order, various other method embodiments may be performed in any logical order and may include fewer or more steps than what is described herein.

In some instances in the described embodiments, various losses, e.g., in height, to the illustrated structures may occur during processing. These losses may not be expressly shown in the figures or described herein, but a person having ordinary skill in the art will readily understand how such losses may occur. Such losses may occur as a result of a planarization process such as a chemical mechanical polish (CMP), an etch process when, for example, the structure realizing the loss is not the primary target of the etching, and other processes.

FIGS. 1, 2, 3A-B, 4A-D, and 5A-C through 18A-B are various views of respective intermediate structures during intermediate stages in an example process of forming a semiconductor device including one or more FinFETs in accordance with some embodiments. FIG. 1 illustrates, in a cross-sectional view, a semiconductor substrate 20 with a stressed semiconductor layer 22 formed thereover. The semiconductor substrate 20 may be or include a bulk semiconductor substrate, a semiconductor-on-insulator (SOI) substrate, or the like, which may be doped (e.g., with a p-type or an n-type dopant) or undoped. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the semiconductor substrate may include an elemental semiconductor such as silicon (Si) and germanium (Ge); a compound semiconductor including silicon carbide, gallium arsenic, gallium phosphide, indium phosphide, indium arsenide, or indium antimonide; an alloy semiconductor including SiGe, GaAsP, AlInAs, AlGaAs, GaInAs, GaInP, or GaInAsP; or a combination thereof.

The stressed semiconductor layer 22 can have a compressive stress or a tensile stress. In some examples, the stressed semiconductor layer 22 is stressed as a result of heteroepitaxial growth on the semiconductor substrate 20. For example, heteroepitaxial growth generally includes epitaxially growing a grown material having a natural lattice constant that is different from the lattice constant of the substrate material at the surface on which the grown material is epitaxially grown. Pseudomorphically growing the grown material on the substrate material can result in the grown material having a stress. If the natural lattice constant of the grown material is greater than the lattice constant of the substrate material, the stress in the grown material can be compressive, and if the natural lattice constant of the grown material is less than the lattice constant of the substrate material, the stress in the grown material can be tensile. For example, pseudomorphically growing SiGe on relaxed silicon can result in the SiGe having a compressive stress, and pseudomorphically growing SiC on relaxed silicon can result in the SiC having a tensile stress.

In other examples, the stressed semiconductor layer 22 can be heteroepitaxially grown on a sacrificial substrate and transferred to the semiconductor substrate 20. The stressed semiconductor layer 22 can be pseudomorphically grown on the sacrificial substrate like described above. Then, the stressed semiconductor layer 22 can be bonded (e.g., using wafer bonding) to the semiconductor substrate 20 using appropriate techniques. The sacrificial substrate can then be removed from the stressed semiconductor layer 22, such as by using a separation by implantation of oxide (SIMOX) technique or another removal technique. The stressed semiconductor layer 22, as bonded to the semiconductor substrate 20, can then be polished, such as by a chemical mechanical polish (CMP). By transferring the stressed semiconductor layer 22 like this, there may be more flexibility in choosing materials, stresses, material thicknesses, etc., since the stress of the stressed semiconductor layer 22 does not depend on growth on the semiconductor substrate 20.

The stressed semiconductor layer 22 can be or include silicon, silicon germanium ($Si_{1-x}Ge_x$, where x can be between approximately 0 and 100), silicon carbide, pure or substantially pure germanium, a III-V compound semiconductor, a II-VI compound semiconductor, or the like. For example, materials for forming a III-V compound semiconductor include InAs, AlAs, GaAs, InP, GaN, InGaAs, InAlAs, GaSb, AlSb, AlP, GaP, and the like. Further, the stressed semiconductor layer 22 can be epitaxially grown using metal-organic chemical vapor deposition (MOCVD), molecular beam epitaxy (MBE), liquid phase epitaxy (LPE), vapor phase epitaxy (VPE), selective epitaxial growth (SEG), the like, or a combination thereof on the semiconductor substrate 20 or a sacrificial substrate. A thickness of the stressed semiconductor layer 22 can be in a range from about 30 nm to about 50 nm.

Figure 2:
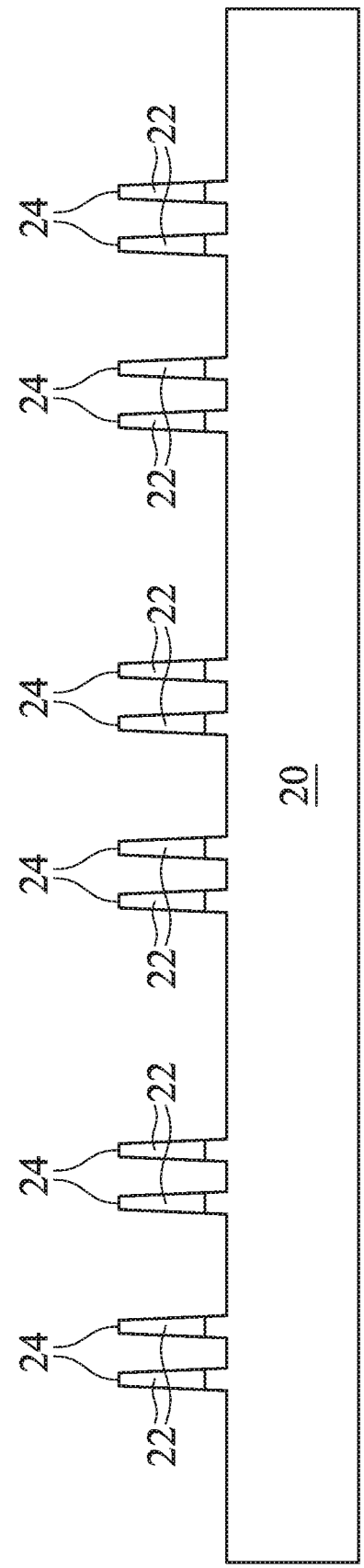

FIG. 2 illustrates, in a cross-sectional view, the formation of fins 24 in the stressed semiconductor layer 22 and/or semiconductor substrate 20. In some examples, a mask (e.g., a hard mask) is used in forming the fins 24. For example, one or more mask layers are deposited over the stressed semiconductor layer 22, and the one or more mask layers are then patterned into the mask. In some examples, the one or more mask layers may include or be silicon nitride, silicon oxynitride, silicon carbide, silicon carbon nitride, the like, or a combination thereof, and may be deposited by chemical vapor deposition (CVD), physical vapor deposition (PVD), atomic layer deposition (ALD), or another deposition technique. The one or more mask layers may be patterned using photolithography. For example, a photo resist can be formed on the one or more mask layers, such as by using spin-on coating, and patterned by exposing the photo resist to light using an appropriate photomask. Exposed or unexposed portions of the photo resist may then be removed depending on whether a positive or negative resist is used. The pattern of the photo resist may then be transferred to the one or more mask layers, such as by using a suitable etch process, which forms the mask. The etch process may include a reactive ion etch (RIE), neutral beam etch (NBE), inductive coupled plasma (ICP) etch, the like, or a combination thereof. The etch process may be anisotropic. Subsequently, the photo resist is removed in an ashing or wet strip processes, for example.

Using the mask, the stressed semiconductor layer 22 and/or semiconductor substrate 20 may be etched such that trenches are formed between neighboring pairs of fins 24 and such that the fins 24 protrude from the semiconductor substrate 20. The etch process may include a RIE, NBE, ICP etch, the like, or a combination thereof. The etch process may be anisotropic. The trenches may be formed to a depth in a range from about 80 nm to about 150 nm from the top surface of the stressed semiconductor layer 22.

Although examples described herein are in the context of stress engineering for the fins 24 (e.g., the fins 24 include respective portions of the stressed semiconductor layer 22), other examples may not implement such stress engineering. For example, the fins 24 may be formed from a bulk semiconductor substrate (e.g., semiconductor substrate 20) without a stressed semiconductor layer. Also, the stressed semiconductor layer 22 may be omitted from subsequent figures; this is for clarity of the figures. In some embodiments where such a stress semiconductor layer is implemented for stress engineering, the stressed semiconductor layer 22 may be present as part of the fins 24 even if not explicitly illustrated; and in some embodiments where such a stress semiconductor layer is not implemented for stress engineering, the fins 24 may be formed from the semiconductor substrate 20.

Figure 3A:
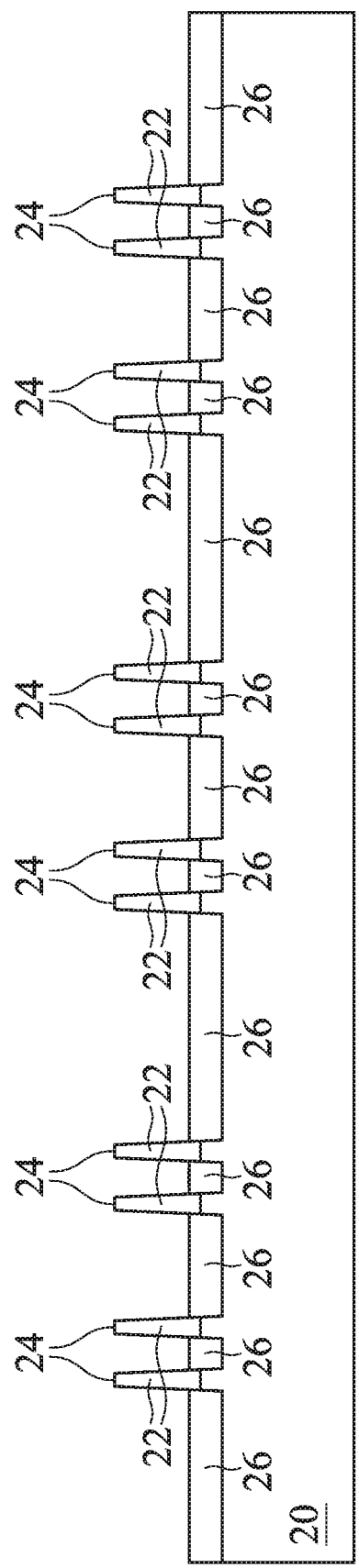
Figure 3B:
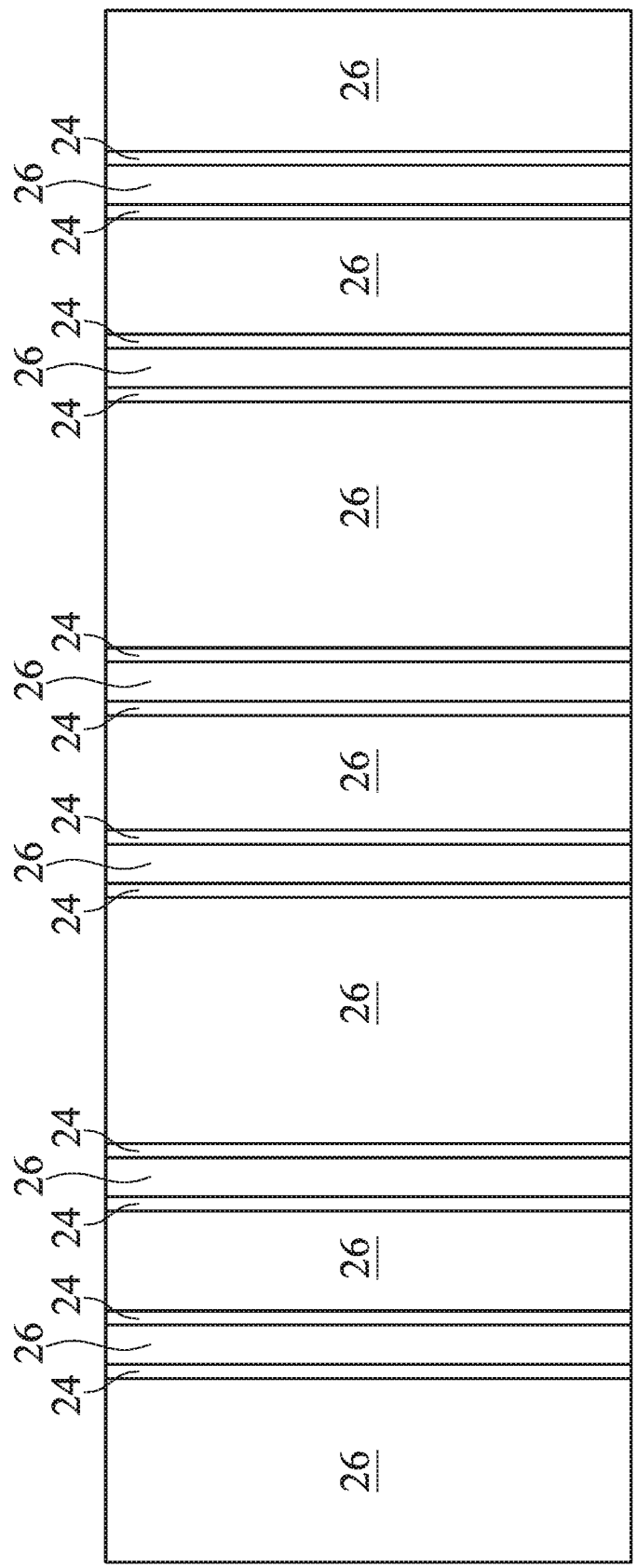

FIGS. 3A and 3B illustrate, in a cross-sectional view and top view, respectively, the formation of isolation regions 26, each in a corresponding trench. The isolation regions 26 may include or be an insulating material such as an oxide (such as silicon oxide), a nitride, the like, or a combination thereof, and the insulating material may be formed by a high density plasma CVD (HDP-CVD), a flowable CVD (FCVD) (e.g., a CVD-based material deposition in a remote plasma system and post curing to make it convert to another material, such as an oxide), the like, or a combination thereof. Other insulating materials formed by any acceptable process may be used. In the illustrated embodiment, the isolation regions 26 include silicon oxide that is formed by a FCVD process. A planarization process, such as a CMP, may remove any excess insulating material and any remaining mask (e.g., used to etch the trenches and form the fins 24) to form top surfaces of the insulating material and top surfaces of the fins 24 to be coplanar. The insulating material may then be recessed to form the isolation regions 26. The insulating material is recessed such that the fins 24 protrude from between neighboring isolation regions 26, which may, at least in part, thereby delineate the fins 24 as active areas on the semiconductor substrate 20. The insulating material may be recessed using an acceptable dry or wet etch process, such as one that is selective to the material of the insulating material. Further, top surfaces of the isolation regions 26 may have a flat surface as illustrated, a convex surface, a concave surface (such as dishing), or a combination thereof, which may result from an etch process. As illustrated in the top view of FIG. 3B, the fins 24 extend longitudinally across the semiconductor substrate 20. The fins 24 may have a height in a range from about 30 nm to about 50 nm from top surfaces of respective neighboring isolation regions 26. For example, the interface between the stressed semiconductor layer 22 and the semiconductor substrate 20 corresponding to each fin 24 can be below top surfaces of the isolation regions 26.

A person having ordinary skill in the art will readily understand that the processes described with respect to FIGS. 1 through 3A-B are just examples of how fins 24 may be formed. In other embodiments, a dielectric layer can be formed over a top surface of the semiconductor substrate 20; trenches can be etched through the dielectric layer; homoepitaxial structures can be epitaxially grown in the trenches (e.g., without stress engineering); and the dielectric layer can be recessed such that the homoepitaxial structures protrude from the dielectric layer to form fins. In still other embodiments, heteroepitaxial structures can be used for the fins. For example, the fins 24 can be recessed (e.g., after planarizing the insulating material of the isolation regions 26 and before recessing the insulating material), and a material different from the fins may be epitaxially grown in their place. In an even further embodiment, a dielectric layer can be formed over a top surface of the semiconductor substrate 20; trenches can be etched through the dielectric layer; heteroepitaxial structures can be epitaxially grown in the trenches using a material different from the semiconductor substrate 20 (e.g., with stress engineering); and the dielectric layer can be recessed such that the heteroepitaxial structures protrude from the dielectric layer to form fins. In some embodiments where homoepitaxial or heteroepitaxial structures are epitaxially grown, the grown materials may be in situ doped during growth, which may obviate prior implanting of the fins although in situ and implantation doping may be used together. Still further, it may be advantageous to epitaxially grow a material for an n-type device different from the material in for a p-type device.

Figure 4A:
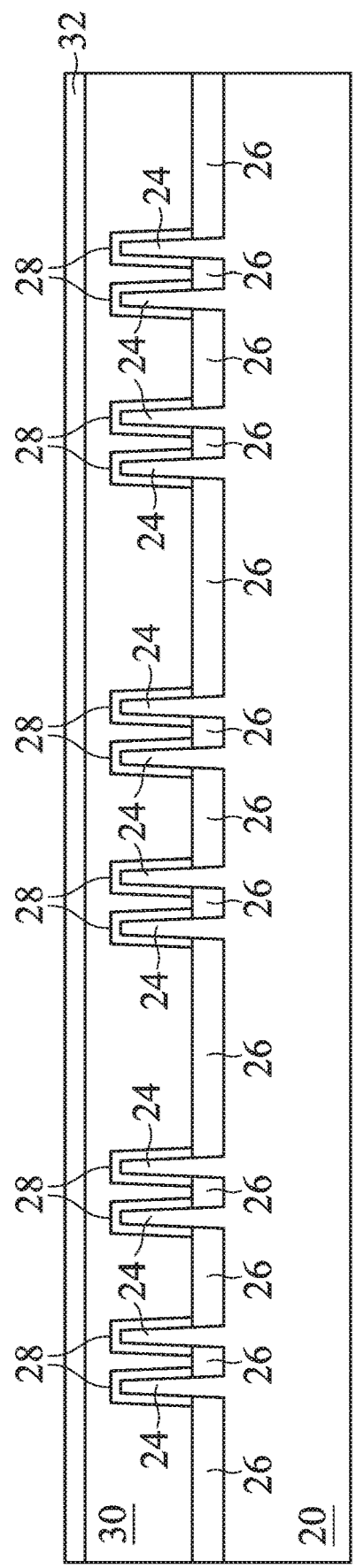
Figure 4B:
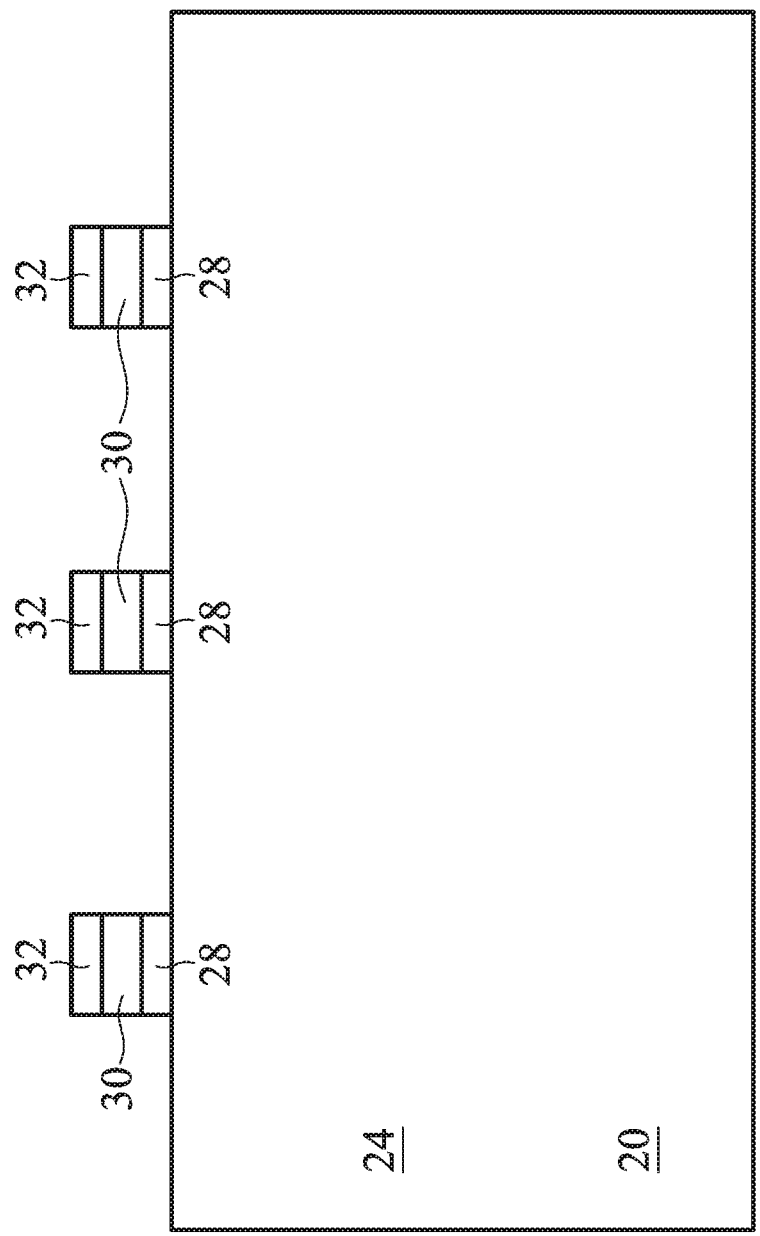
Figure 4C:
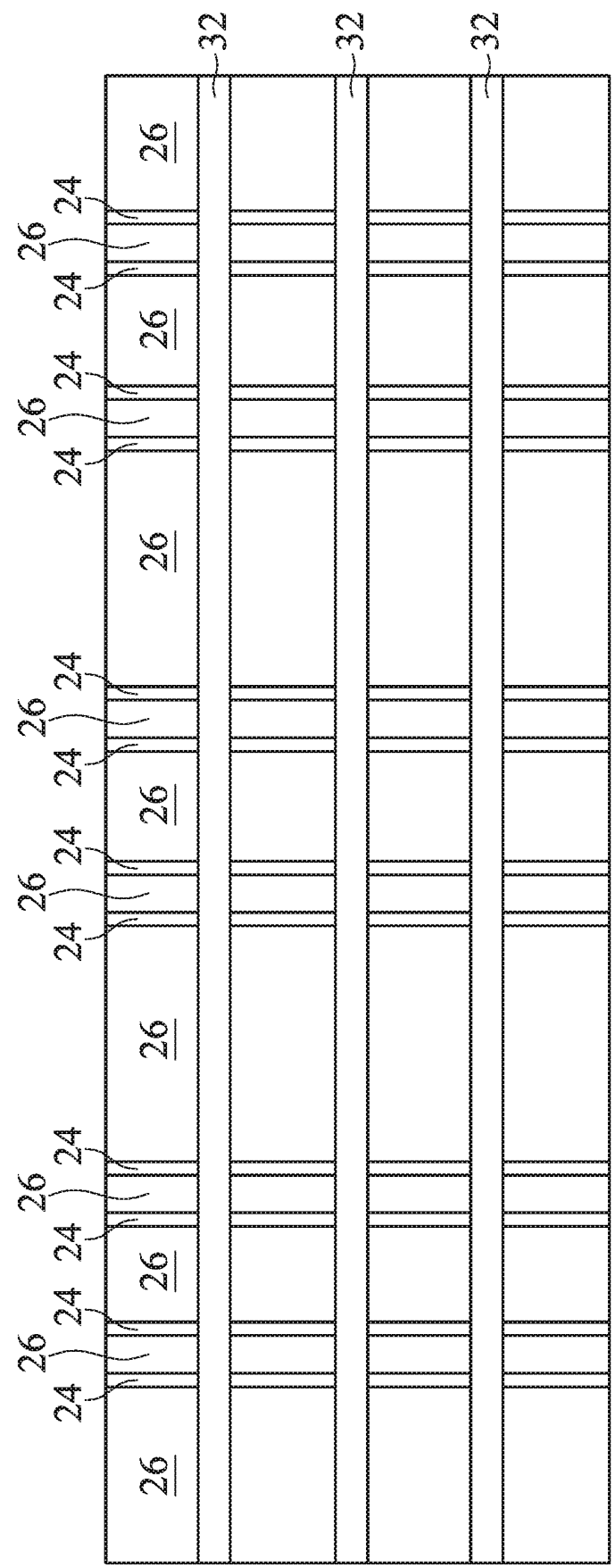
Figure 4D:
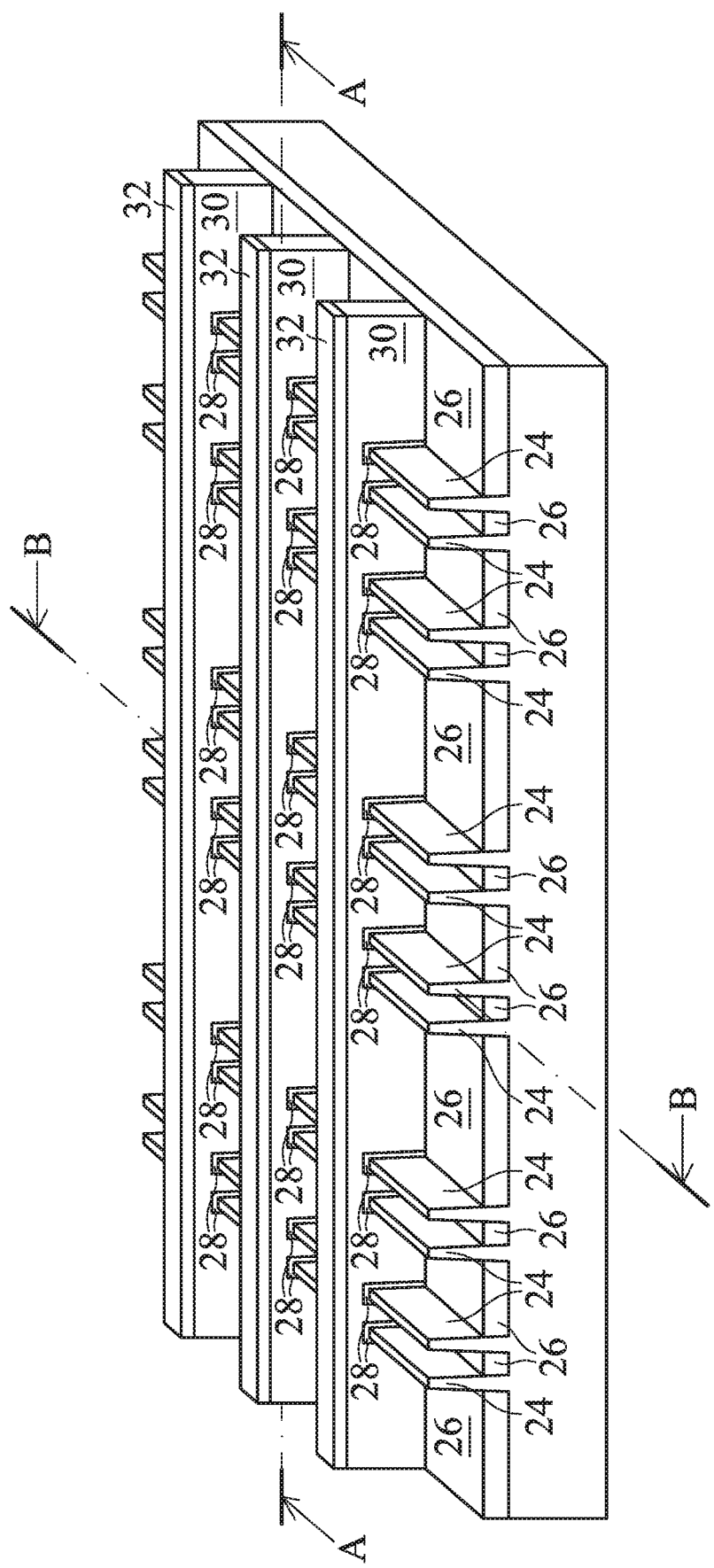

FIGS. 4A, 4B, 4C and 4D illustrate the formation of dummy gate stacks on the fins 24. FIGS. 4A and 4B illustrate cross-sectional views; FIG. 4C illustrates a top view; and FIG. 4D illustrates a three-dimensional view. FIG. 4D illustrates cross-sections A-A and B-B. FIGS. 1, 2, 3A, 4A, and the following figures ending with an "A" designation illustrate cross-sectional views at various instances of processing corresponding to cross-section A-A, and FIG. 4B and the following figures ending with a "B" designation illustrate cross-sectional views at various instances of processing corresponding to cross-section B-B. In some figures, some reference numbers of components or features illustrated therein may be omitted to avoid obscuring other components or features; this is for ease of depicting the figures.

The dummy gate stacks are over and extend laterally perpendicularly to the fins 24. Each dummy gate stack, or more generally, gate structure, comprises one or more interfacial dielectrics 28, a dummy gate 30, and a mask 32. The one or more interfacial dielectrics 28, dummy gates 30, and mask 32 for the dummy gate stacks may be formed by sequentially forming respective layers, and then patterning those layers into the dummy gate stacks. For example, a layer for the one or more interfacial dielectrics 28 may include or be silicon oxide, silicon nitride, the like, or multilayers thereof, and may be thermally and/or chemically grown on the fins 24, as illustrated, or conformally deposited, such as by plasma-enhanced CVD (PECVD), ALD, or another deposition technique. A layer for the dummy gates 30 may include or be silicon (e.g., polysilicon) or another material deposited by CVD, PVD, or another deposition technique. A layer for the mask 32 may include or be silicon nitride, silicon oxynitride, silicon carbon nitride, the like, or a combination thereof, deposited by CVD, PVD, ALD, or another deposition technique. The layers for the mask 32, dummy gates 30, and one or more interfacial dielectrics 28 may then be patterned, for example, using photolithography and one or more etch processes, like described above, to form the mask 32, dummy gate 30, and one or more interfacial dielectrics 28 for each dummy gate stack.

In some embodiments, after forming the dummy gate stacks, lightly doped drain (LDD) regions (not specifically illustrated) may be formed in the fins 24. For example, dopants may be implanted into the fins 24 using the dummy gate stacks as masks. Example dopants for the LDD regions can include or be, for example, boron for a p-type device and phosphorus or arsenic for an n-type device, although other dopants may be used. The LDD regions may have a dopant concentration in a range from about $10^{15}$ cm$^{-3}$ to about $10^{17}$ cm$^{-3}$.

The cross-section A-A is along a gate stack through which a cut will be made in subsequent figures and description. The cross-section B-B is along a fin 24 (e.g., along a channel direction in the fin 24) through which a cut will be made in subsequent figures and description. Cross-sections A-A and B-B are perpendicular to each other.

Figure 5A:
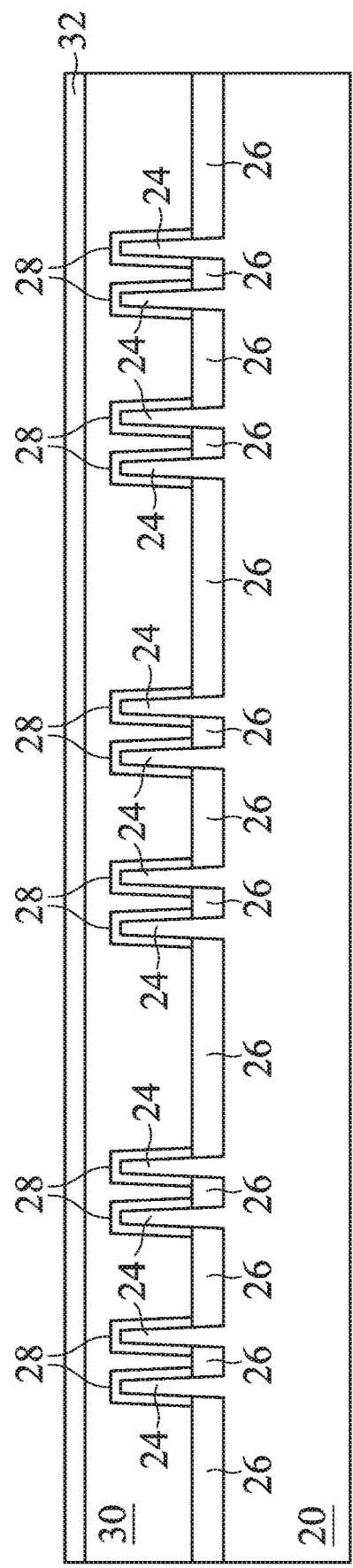
Figure 5B:
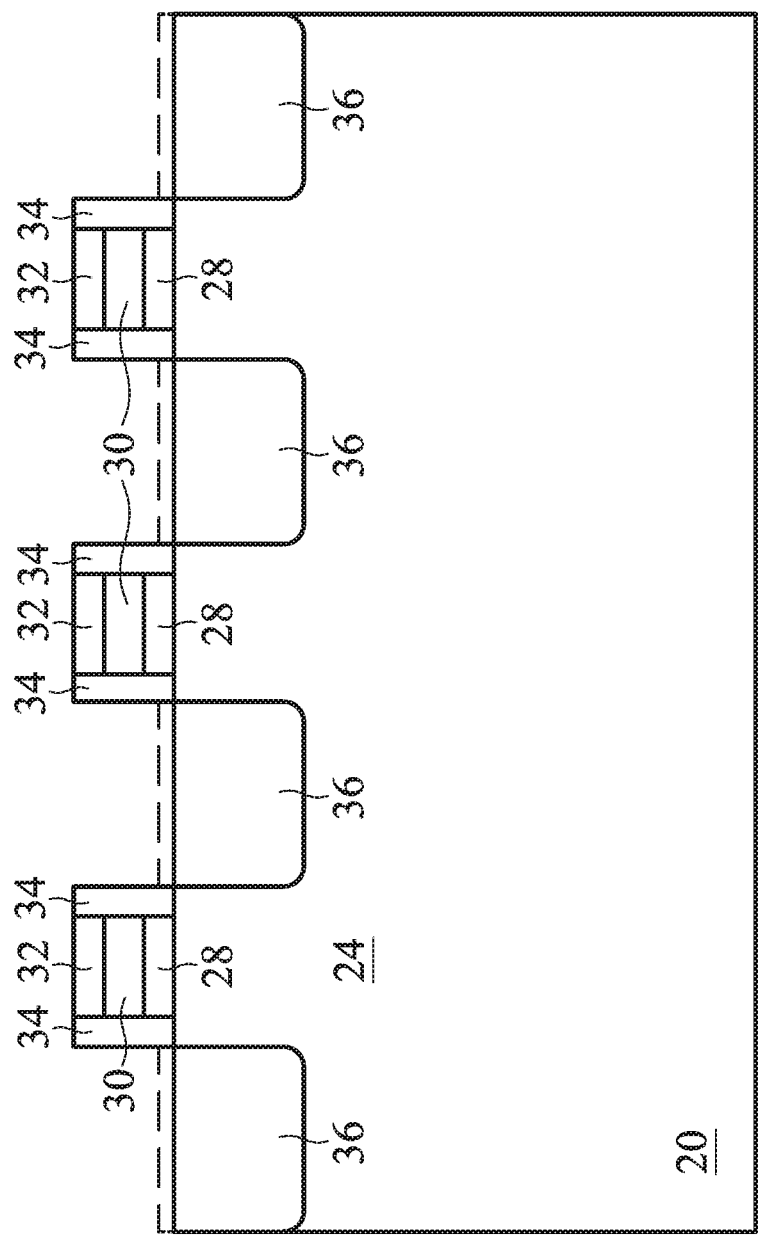
Figure 5C:
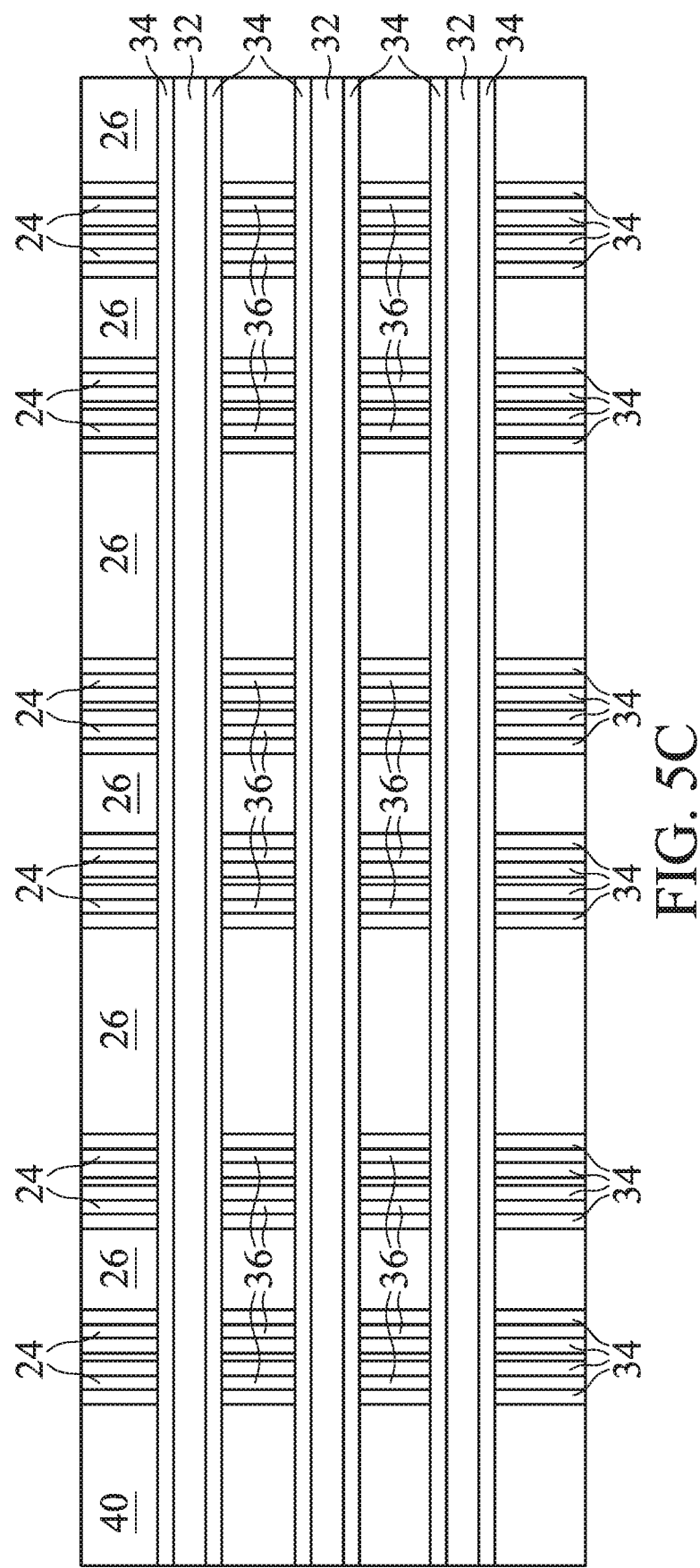

FIGS. 5A, 5B, and 5C illustrate the formation of gate spacers 34. Gate spacers 34 are formed along sidewalls of the dummy gate stacks (e.g., sidewalls of the one or more interfacial dielectrics 28, dummy gates 30, and masks 32) and over the fins 24. Additionally, residual gate spacers 34 may be formed along exposed sidewalls of the fins 24, as illustrated in the figures. The gate spacers 34 may be formed by conformally depositing one or more layers for the gate spacers 34 and anisotropically etching the one or more layers, for example. The one or more layers for the gate spacers 34 may include or be silicon nitride, silicon oxynitride, silicon carbon nitride, silicon oxycarbide, the like, multi-layers thereof, or a combination thereof, and the etch process can include a RIE, NBE, or another etch process.

Source/drain regions 36 are then formed in the fins 24. Recesses for source/drain regions are formed in the fins 24 on opposing sides of the dummy gate stacks. The recessing can be by an etch process. The etch process can be isotropic or anisotropic, or further, may be selective with respect to one or more crystalline planes of the stressed semiconductor layer 22 and/or semiconductor substrate 20. Hence, the recesses can have various cross-sectional profiles based on the etch process implemented. The etch process may be a dry etch process, such as a RIE, NBE, or the like, or a wet etch process, such as using tetramethylammonium hydroxide (TMAH), ammonium hydroxide (NH$_4$OH), or another etchant. The recesses may extend to a depth in a range from about 0 nm to about 80 nm from respective top surfaces of the fins 24 into the fins 24. For example, the recesses may, in some instances, not extend below a level of top surfaces of neighboring isolation regions 26 and/or below the interface between the stressed semiconductor layer 22 and the semiconductor substrate 20; although in other instances, the recesses may extend below a level of top surfaces of neighboring isolation regions 26 and/or the interface.

Epitaxy source/drain regions 36 are formed in the recesses in the fins 24. The epitaxy source/drain regions 36 may include or be silicon germanium ($Si_{1-x}Ge_x$, where x can be between approximately 0 and 100), silicon carbide, silicon phosphorus, silicon carbon phosphorus, pure or substantially pure germanium, a III-V compound semiconductor, a II-VI compound semiconductor, or the like. For example, materials for forming a III-V compound semiconductor include InAs, AlAs, GaAs, InP, GaN, InGaAs, InAlAs, GaSb, AlSb, AlP, GaP, and the like. The epitaxy source/drain regions 36 may be formed in the recesses by epitaxially growing a material in the recesses, such as by MOCVD, MBE, LPE, VPE, SEG, the like, or a combination thereof. Due to blocking by the isolation regions 26 and/or residual gate spacers 34 depending on the depth of the recess in which the epitaxy source/drain region 36 is formed, epitaxy source/drain regions 36 may be first grown vertically in recesses, during which time the epitaxy source/drain regions 36 do not grow horizontally. After the recesses within the isolation regions 26 and/or residual gate spacers 34 are fully filled, the epitaxy source/drain regions 36 may grow both vertically and horizontally to form facets, which may correspond to crystalline planes of the semiconductor substrate 20. Epitaxy source/drain regions 36 may be raised in relation to the fin 24, as illustrated by dashed lines in FIG. 5B. In some examples, different materials are used for epitaxy source/drain regions for p-type devices and n-type devices. Appropriate masking during the recessing or epitaxial growth may permit different materials to be used in different devices.

In an example, the FinFETs being formed, as illustrated, are p-type FinFETs; the semiconductor substrate 20 is a bulk silicon substrate; the stressed semiconductor layer 22 is $Si_{1-x}Ge_x$; and the epitaxy source/drain regions 36 are $Si_{1-y}Ge_y$, where y increases from a bottom surface of the recess in which the respective epitaxy source/drain region 36 is grown to a top surface of the epitaxy source/drain region 36 (e.g., by discrete step increases, by continuous increase, or by a combination thereof) and where each instance of y is greater than each instance of x. Further, in that example, the recesses do not extend to a level below top surfaces of neighboring isolation regions 26 and do not extend below the interface between the stressed semiconductor layer 22 and the semiconductor substrate 20. A person having ordinary skill in the art will understand modifications that may be implemented to achieve, for example, n-type FinFETs and/or other p-type FinFETs.

Additionally or alternatively, in some examples, the source/drain regions 36 are formed by implanting dopants into the fins 24 using the dummy gate stacks and gate spacers 34 as masks. Hence, source/drain regions 36 can be formed by implantation on opposing sides of each dummy gate stack. Epitaxy source/drain regions 36 may be doped by in situ doping during the epitaxial growth and/or by implantation after the epitaxial growth. Hence, source/drain regions 36 can be formed by epitaxial growth, and possibly with implantation, on opposing sides of each dummy gate stack. Example dopants for source/drain regions 36 can include or be, for example, boron for a p-type device and phosphorus or arsenic for an n-type device, although other dopants may be used. The source/drain regions 36 may have a dopant concentration in a range from about $10^{19}$ cm$^{-3}$ to about $10^{21}$ cm$^{-3}$.

Figure 6A:
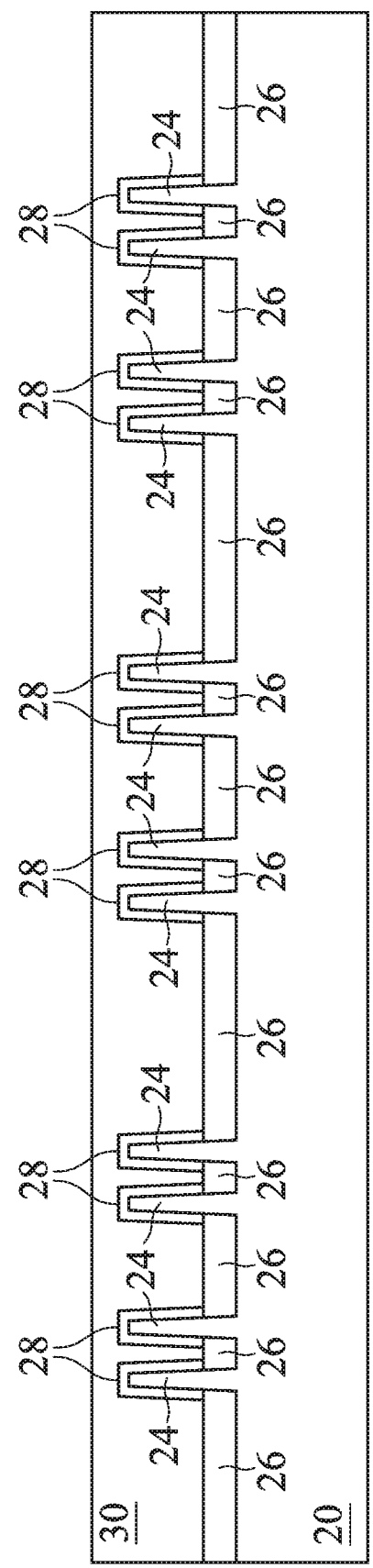
Figure 6B:
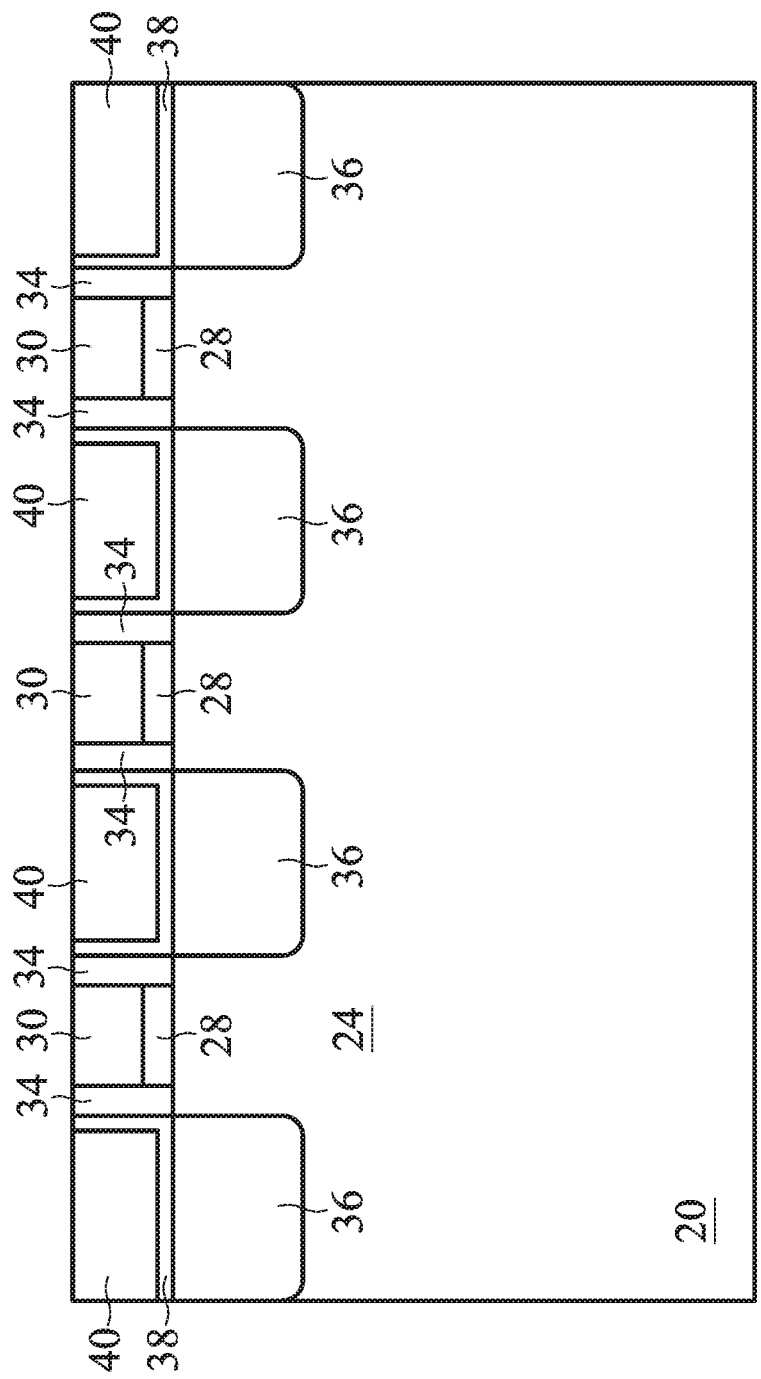
Figure 6C:
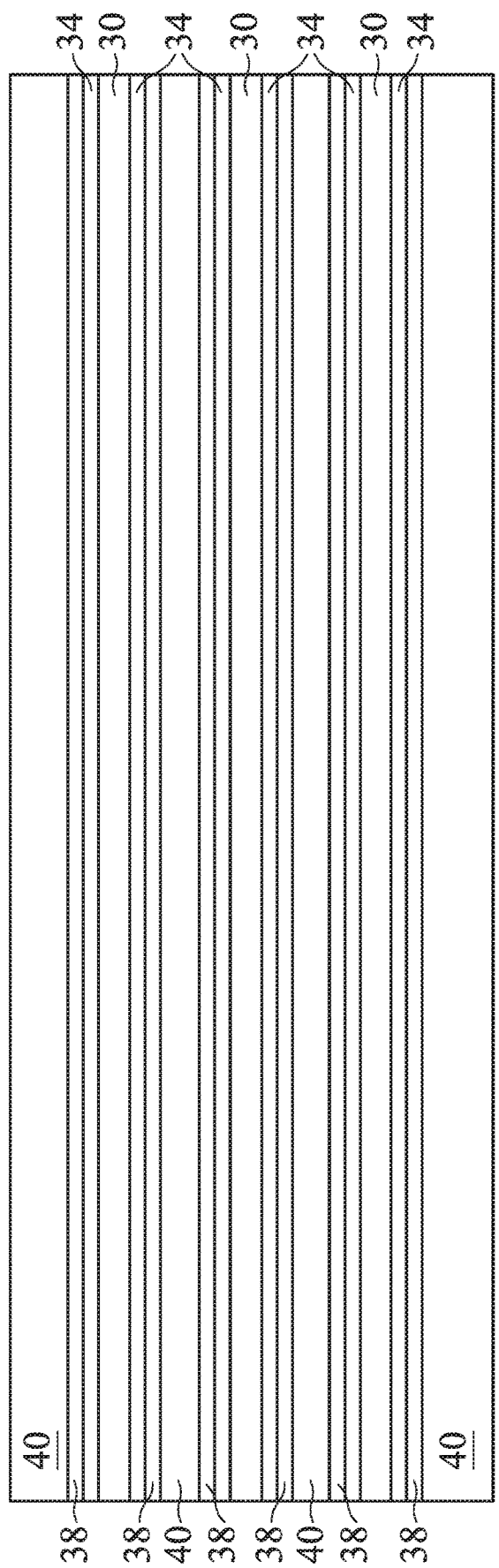

FIGS. 6A, 6B, and 6C illustrate the formation of an etch stop layer (ESL) 38 and a first interlayer dielectric (ILD) 40. Generally, an ESL can provide a mechanism to stop etching in an etch process when forming, e.g., contacts or vias. An ESL may be formed of a dielectric material having a different etch selectivity from adjacent layers, for example, the interlayer dielectric. The ESL 38 may be conformally deposited over the fins 24, dummy gate stacks, gate spacers 34, and isolation regions 26. The ESL 38 may comprise or be silicon nitride, silicon carbon nitride, silicon carbon oxide, carbon nitride, the like, or a combination thereof, and may be deposited by CVD, PECVD, ALD, or another deposition technique. The first ILD 40 is deposited over the ESL 38. The first ILD 40 may comprise or be silicon dioxide, a low-k dielectric material (e.g., a material having a dielectric constant lower than silicon dioxide), such as silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), $SiO_xC_y$, Spin-On-Glass, Spin-On-Polymers, silicon carbon material, a compound thereof, a composite thereof, the like, or a combination thereof. The first ILD 40 may be deposited by spin-on, CVD, FCVD, PECVD, PVD, or another deposition technique.

The ESL 38 and first ILD 40 are formed with top surfaces coplanar with top surfaces of the dummy gates 30. A planarization process, such as a CMP, may be performed to level the top surfaces of the first ILD 40 and ESL 38 with the top surfaces of the dummy gates 30. The CMP may also remove the mask 32 (and, in some instances, upper portions of the gate spacers 34) on the dummy gates 30. Accordingly, top surfaces of the dummy gates 30 are exposed through the first ILD 40 and ESL 38.

Figure 7A:
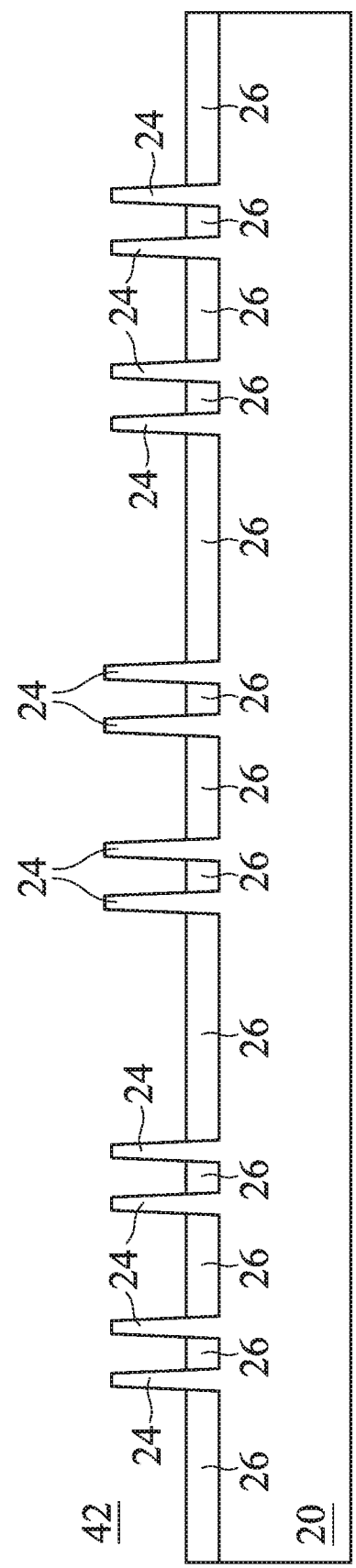
Figure 7B:
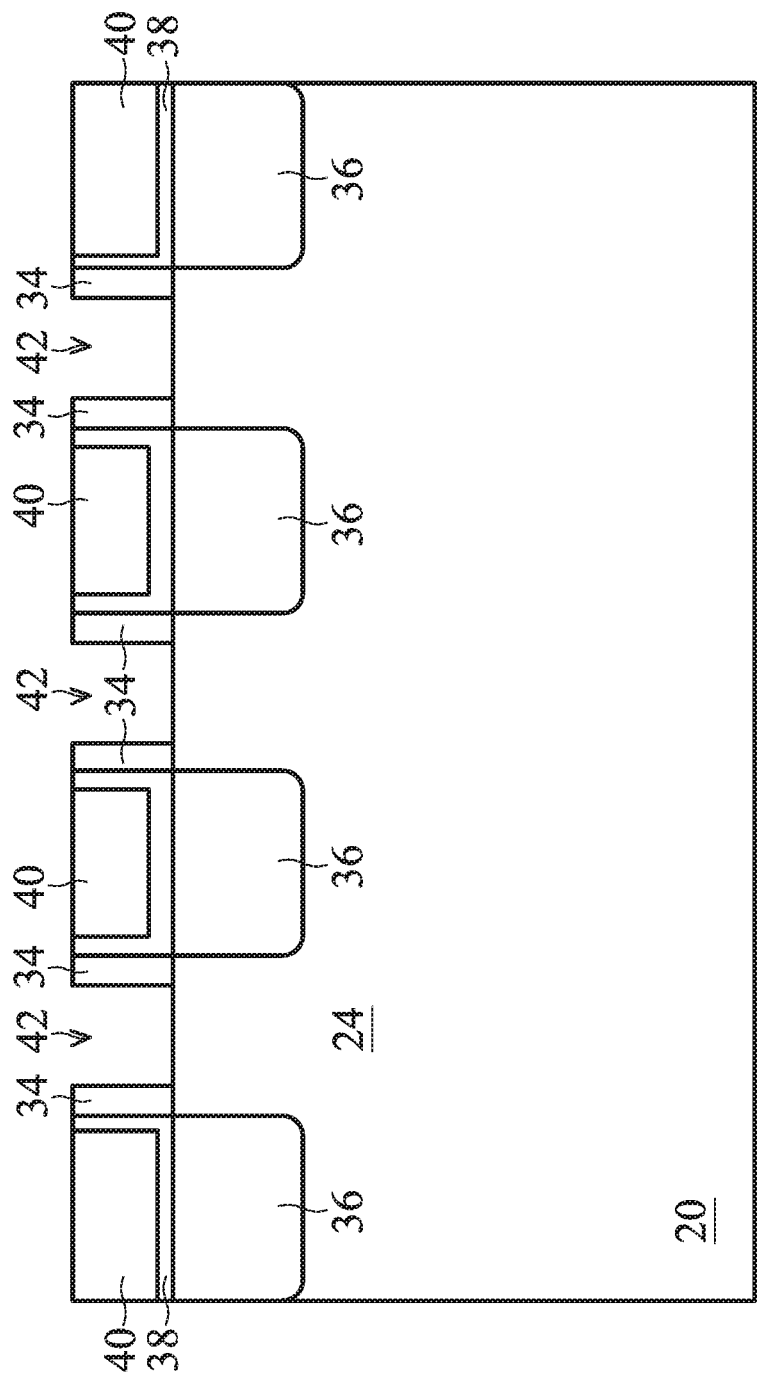
Figure 7C:
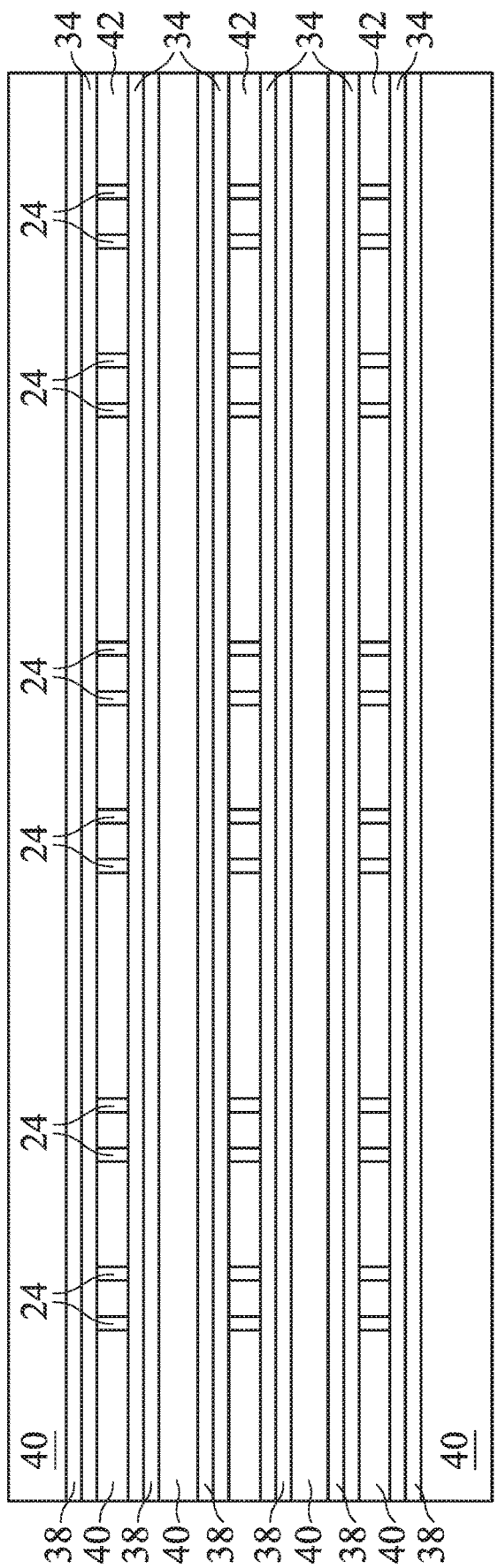

FIGS. 7A, 7B, and 7C illustrate the removal of the dummy gate stacks. The dummy gates 30 and one or more interfacial dielectrics 28 are removed, such as by one or more etch processes. The dummy gates 30 may be removed by an etch process selective to the dummy gates 30, wherein the one or more interfacial dielectrics 28 act as ESLs, and subsequently, the one or more interfacial dielectrics 28 can be removed by a different etch process selective to the one or more interfacial dielectrics 28. The etch processes can be, for example, a RIE, NBE, a wet etch process, or another etch process. Recesses 42 are formed between gate spacers 34 where the dummy gate stacks are removed, and channel regions of the fins 24 are exposed through the recesses 42.

Figure 8A:
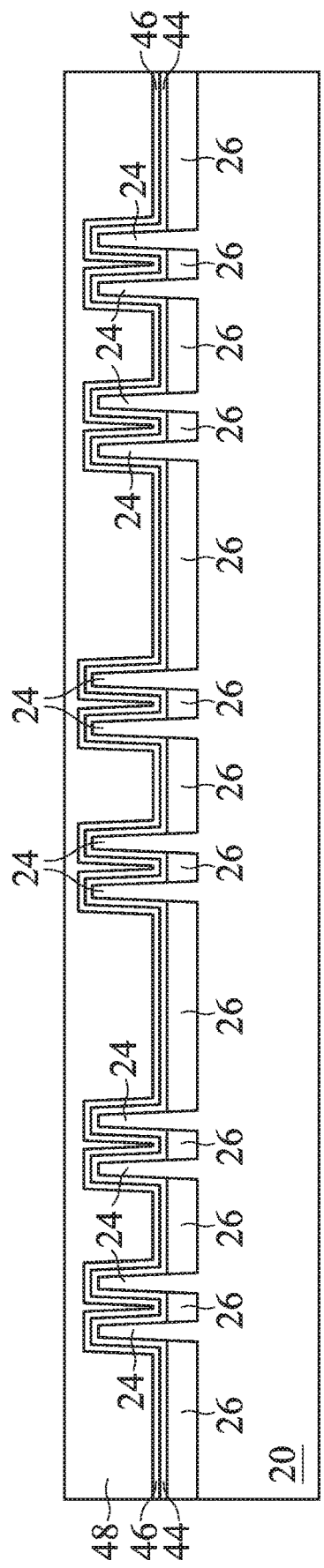
Figure 8B:
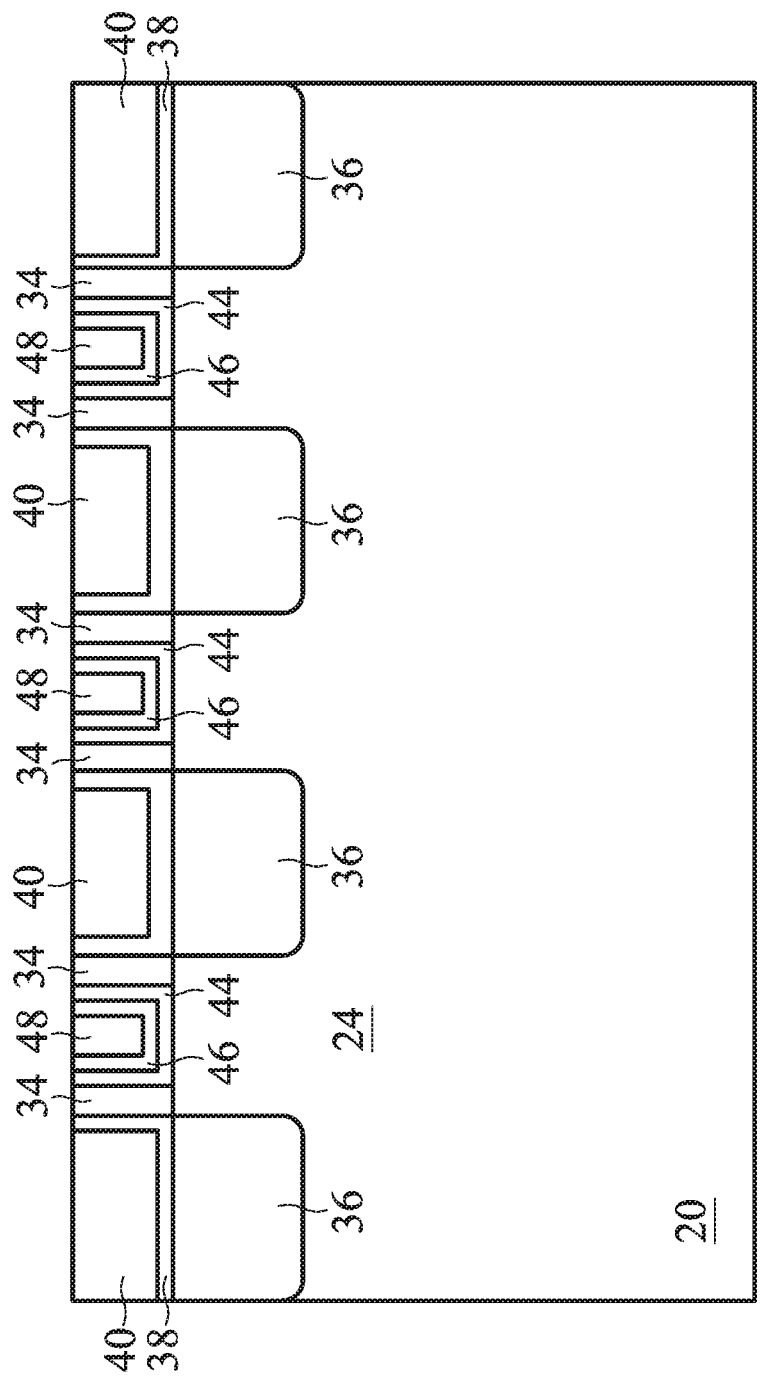
Figure 8C:
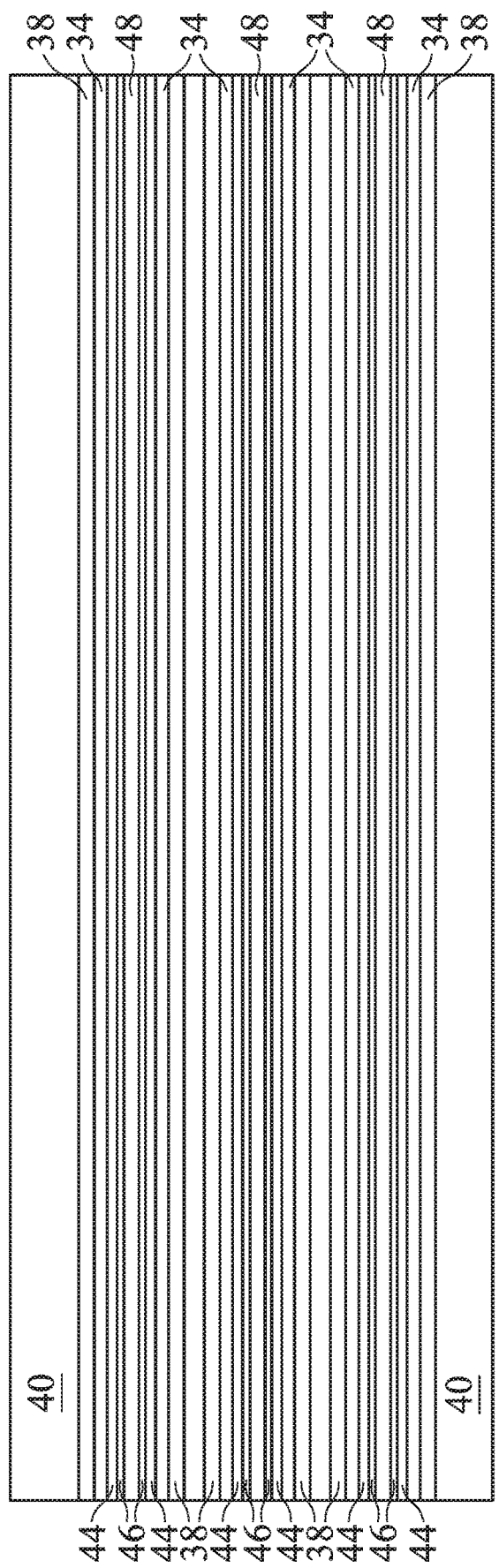

FIGS. 8A, 8B, and 8C illustrate the formation of replacement gate structures in the recesses 42. The replacement gate structures each include a gate dielectric layer 44, one or more optional conformal layers 46, and a gate electrode 48.

The gate dielectric layer 44 is conformally deposited in the recesses 42 (e.g., on top surfaces of the isolation regions 26, sidewalls and top surfaces of the fins 24 along the channel regions, and sidewalls of the gate spacers 34) and on the top surfaces of the gate spacers 34, the ESL 38, and first ILD 40. The gate dielectric layer 44 can be or include silicon oxide, silicon nitride, a high-k dielectric material, multilayers thereof, or other dielectric material. A high-k dielectric material may have a k value greater than about 7.0, and may include a metal oxide of or a metal silicate of hafnium (Hf), aluminum (Al), zirconium (Zr), lanthanum (La), magnesium (Mg), barium (Ba), titanium (Ti), lead (Pb), multilayers thereof, or a combination thereof. The gate dielectric layer 44 can be deposited by ALD, PECVD, MBD, or another deposition technique.

Then, the one or more optional conformal layers 46 can be conformally (and sequentially, if more than one) deposited on the gate dielectric layer 44. The one or more optional conformal layers 46 can include one or more barrier and/or capping layers and one or more work-function tuning layers. The one or more barrier and/or capping layers can include a nitride, silicon nitride, carbon nitride, and/or aluminum nitride of tantalum and/or titanium; a nitride, carbon nitride, and/or carbide of tungsten; the like; or a combination thereof; and may be deposited by ALD, PECVD, MBD, or another deposition technique. The one or more work-function tuning layer may include or be a nitride, silicon nitride, carbon nitride, aluminum nitride, aluminum oxide, and/or aluminum carbide of titanium and/or tantalum; a nitride, carbon nitride, and/or carbide of tungsten; cobalt; platinum; the like; or a combination thereof; and may be deposited by ALD, PECVD, MBD, or another deposition technique. In some examples, a capping layer (e.g., a TiN layer) is formed conformally on the gate dielectric layer 44; a first barrier layer (e.g., a TaN layer) is formed conformally on the capping layer; one or more work-function tuning layers are sequentially formed conformally on the first barrier layer; and a second barrier layer (e.g., a TiN layer) is formed on the one or more work-function tuning layers.

A layer for the gate electrodes 48 is formed over the gate dielectric layer 44 and, if implemented, the one or more optional conformal layers 46. The layer for the gate electrodes 48 can fill remaining recesses 42 where the dummy gate stacks were removed. The layer for the gate electrodes 48 may be or comprise a metal-containing material such as tungsten, cobalt, aluminum, ruthenium, copper, multi-layers thereof, a combination thereof, or the like. The layer for the gate electrodes 48 can be deposited by ALD, PECVD, MBD, PVD, or another deposition technique.

Portions of the layer for the gate electrodes 48, one or more optional conformal layers 46, and gate dielectric layer 44 above the top surfaces of the first ILD 40, ESL 38, and gate spacers 34 are removed. For example, a planarization process, like a CMP, may remove the portions of the layer for the gate electrodes 48, one or more optional conformal layers 46, and gate dielectric layer 44 above the top surfaces of the first ILD 40, ESL 38, and gate spacers 34. Each replacement gate structure comprising the gate electrode 48, one or more optional conformal layers 46, and gate dielectric layer 44 may therefore be formed as illustrated in FIG. 8A-C.

Figure 9A:
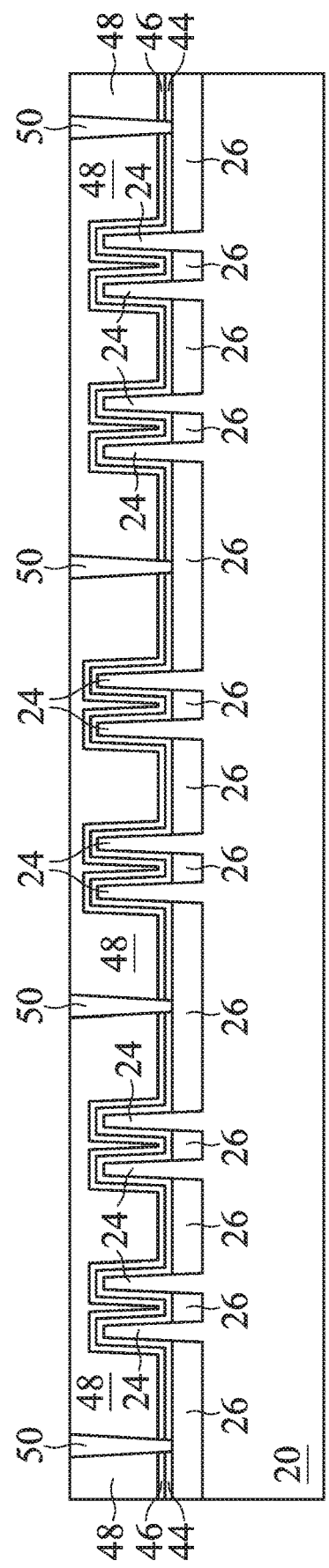
Figure 9B:
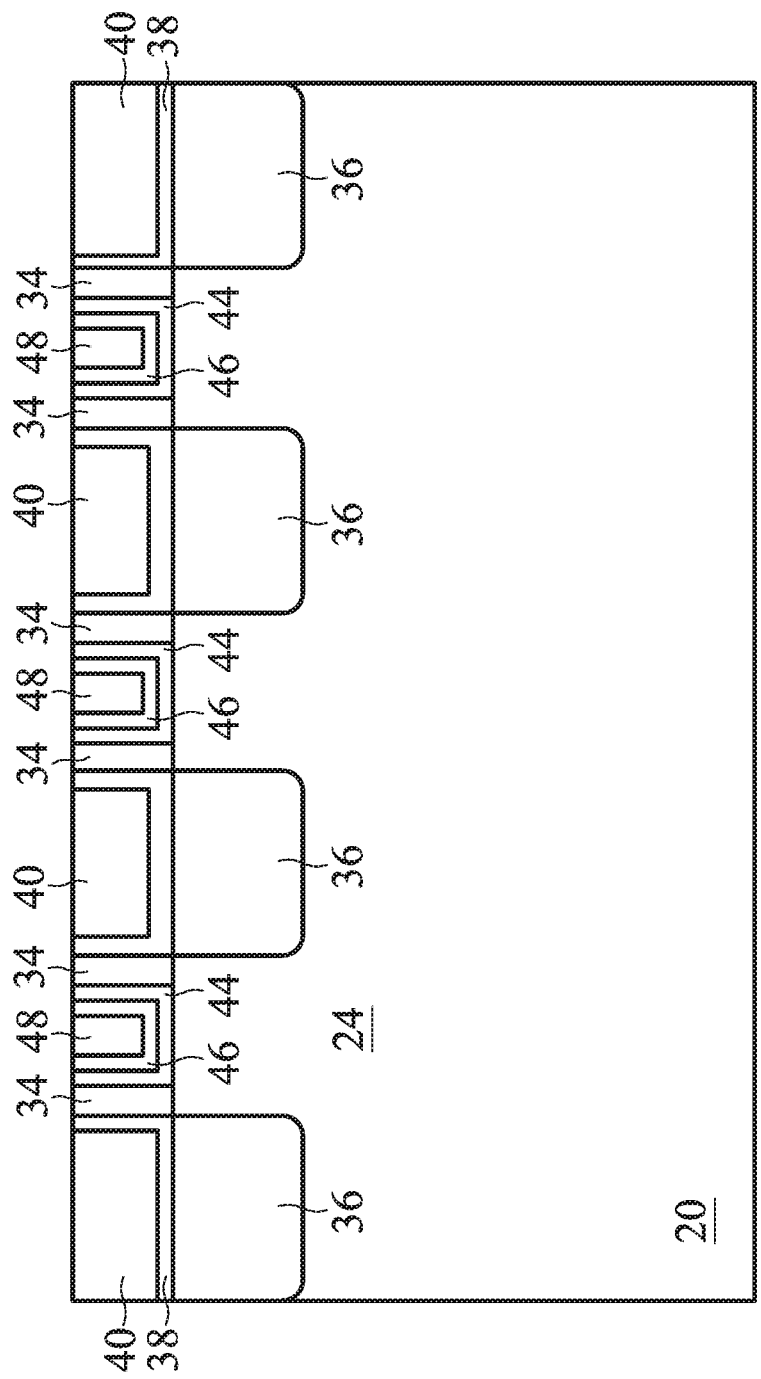
Figure 9C:
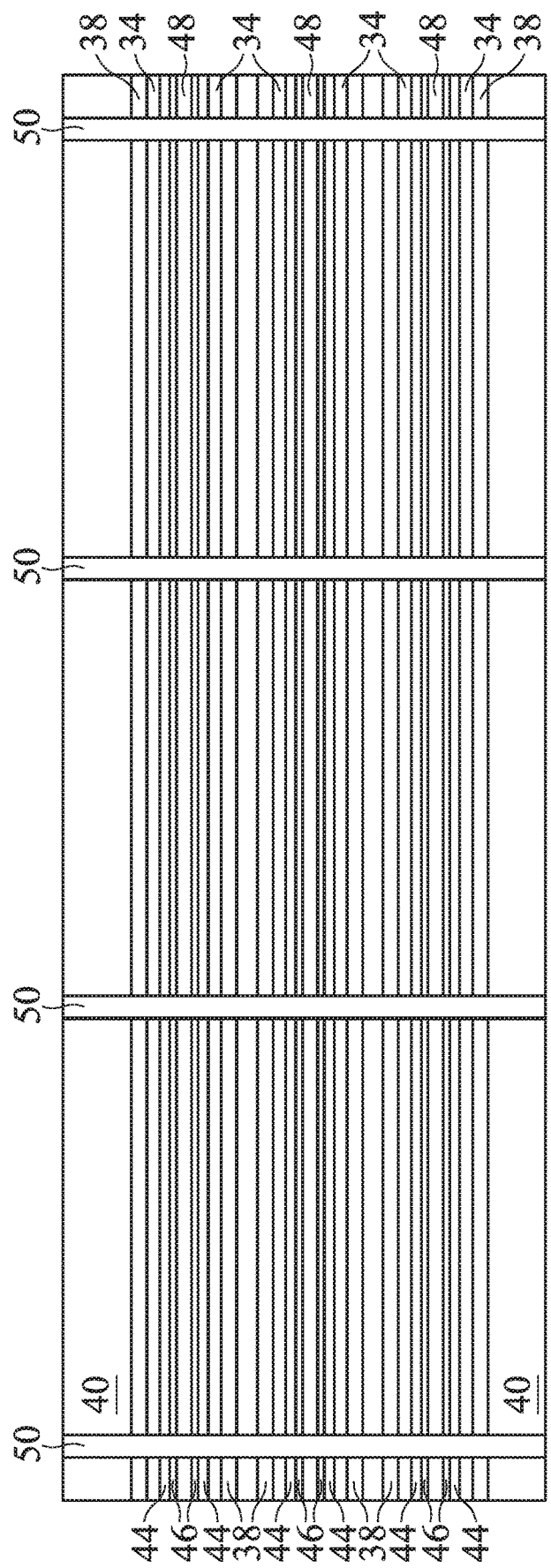

FIGS. 9A, 9B, and 9C illustrate the cutting of the replacement gate structures. The cutting of the replacement gate structures forms gate cut-fill structures 50 that extend laterally perpendicularly to the replacement gate structures and dissect the replacement gate structures. As indicated below, in some examples, the gate cut-fill structure 50 is an insulating material, and hence, portions of a replacement gate structure that were integral before the cutting of the replacement gate structure can be made to be electrically isolated sections from each other because of the gate cut-fill structure 50.

In some examples, a mask (e.g., a hard mask) is used to cut the replacement gate structures. For example, one or more mask layers are deposited over the replacement gate structures, gate spacers 34, ESL 38, and first ILD 40, and the one or more mask layers are then patterned into the mask. In some examples, the one or more mask layers may include or be silicon nitride, silicon oxynitride, silicon carbide, silicon carbon nitride, the like, or a combination thereof, and may be deposited by CVD, PVD, ALD, or another deposition technique. The one or more mask layers may be patterned using photolithography and etch processes, as previously described. The mask can have mask openings extending in a direction laterally perpendicular to and intersecting the replacement gate structures.

Using the mask, the replacement gate structures, gate spacers 34, ESL 38, and first ILD 40 may be etched such that trenches are formed cutting the replacement gate structures. The trenches can extend to a depth to and/or into the corresponding isolation regions 26, e.g., through the gate electrodes 48, one or more optional conformal layers 46, and gate dielectric layer 44. The etch process may include a RIE, NBE, ICP etch, the like, or a combination thereof. The etch process may be anisotropic. An insulating material for the gate cut-fill structures 50 is deposited in the trenches that cut the replacement gate structures. In some examples, each of the gate cut-fill structures 50 may be a single insulating material, and in other examples, the gate cut-fill structures 50 may include multiple different insulating materials, such as in a multi-layered configuration. In some examples, the insulating material may include or be silicon oxide, silicon nitride, silicon oxynitride, silicon carbide, silicon carbon nitride, the like, or a combination thereof, and may be deposited by CVD, PVD, ALD, or another deposition technique. Portions of the insulating material for the gate cut-fill structures 50 and the mask above the top surface of the first ILD 40, ESL 38, gate spacers 34, and replacement gate structures are removed. For example, a planarization process, like a CMP, may remove the portions of the insulating material for the gate cut-fill structures 50 and the mask above the top surface of the first ILD 40, ESL 38, gate spacers 34, and replacement gate structures, and top surfaces of the gate cut-fill structures 50 may be formed coplanar with the top surfaces of the first ILD 40, ESL 38, gate spacers 34, and replacement gate structures. The gate cut-fill structures 50 therefore electrically isolate sections of the replacement gate structures that were cut from each other. As illustrated in FIG. 9A, with the replacement gate structures being cut after the replacement gate structures are formed (e.g., deposited), the gate dielectric layer 44 and/or one or more optional conformal layers 46 do not extend vertically along a sidewall of the gate cut-fill structures 50. Although the gate cut-fill structures 50 are illustrated in FIG. 9A as having a positive taper profile (e.g., sidewalls of components abutting the gate cut-fill structures 50 have angles with the bottom surfaces of the components adjoining the sidewalls is less than 90 degrees interior to those components, respectively), the gate cut-fill structures 50 may have a vertical profile (e.g., angels that are 90 degrees) or a re-entrant profile (e.g., angles that are greater than 90 degrees). The etching to form the trenches in which the gate cut-fill structures 50 are formed may cause such profiles to be formed.

Figure 10A:
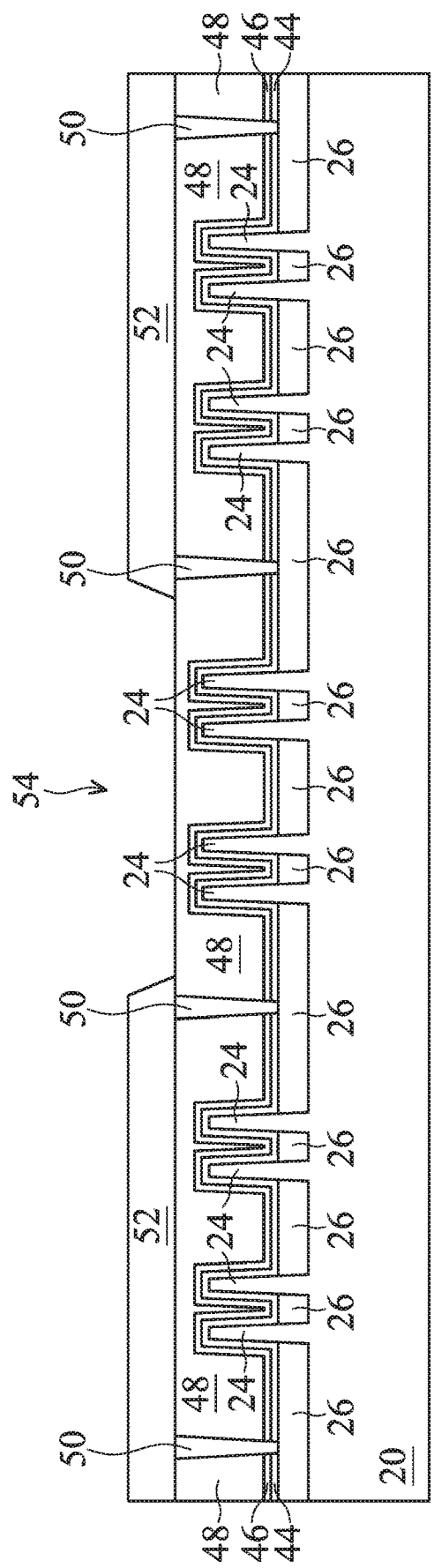
Figure 10B:
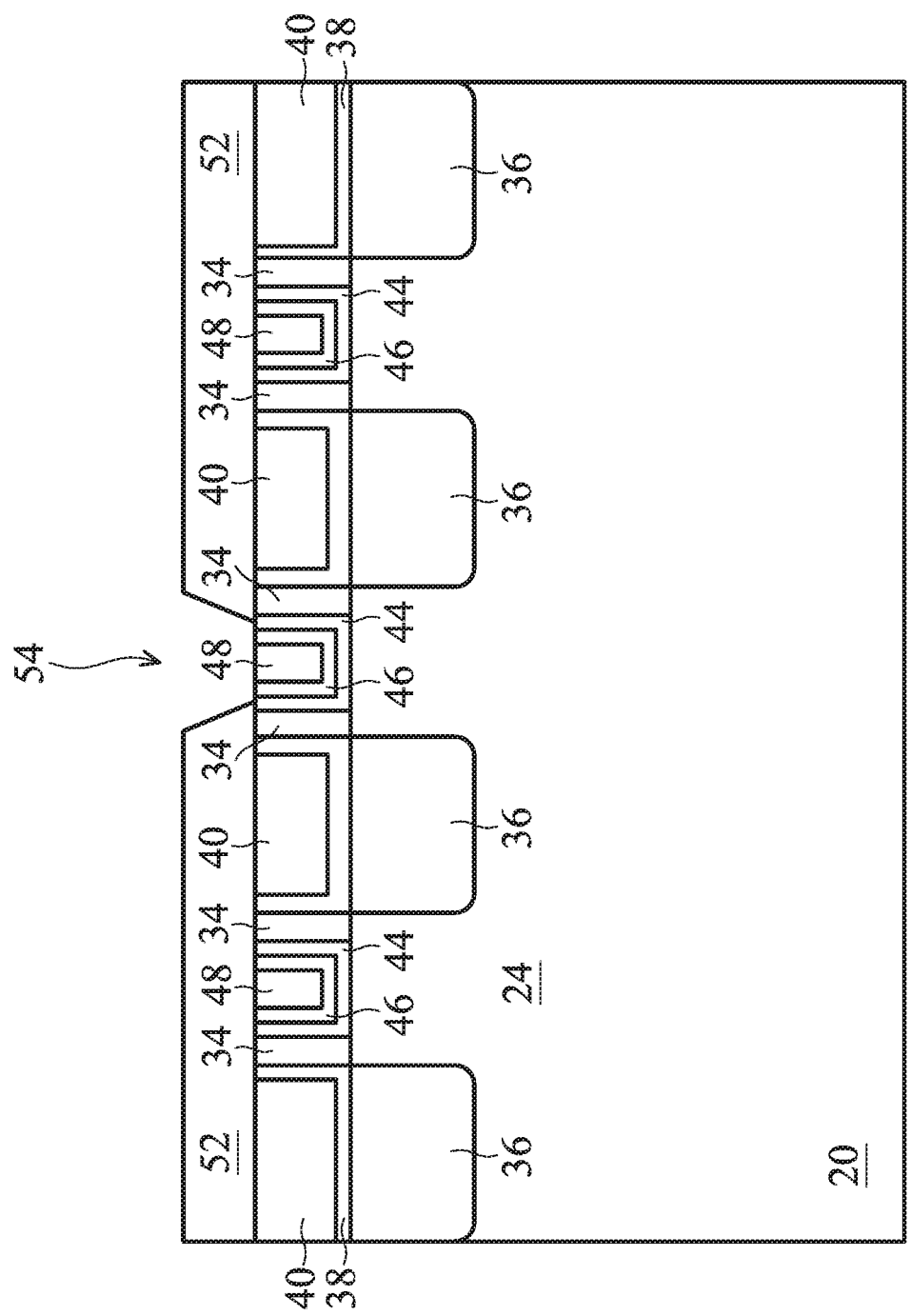
Figure 10C:
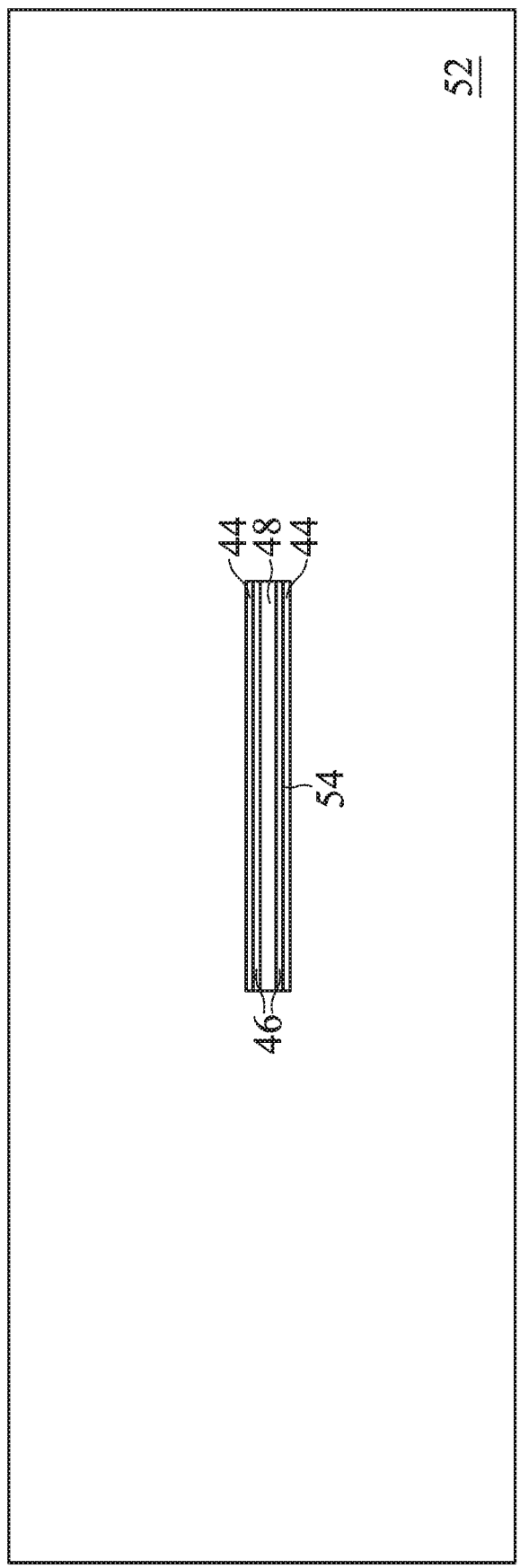

FIGS. 10A, 10B, and 10C illustrate the formation of a mask 52 with mask opening 54 used for cutting fins 24. For example, one or more mask layers are deposited over the replacement gate structures, gate spacers 34, ESL 38, first ILD 40, and gate cut-fill structures 50, and the one or more mask layers are then patterned into the mask 52. In some examples, the one or more mask layers may include or be silicon nitride, silicon oxynitride, silicon carbide, silicon carbon nitride, the like, or a combination thereof, and may be deposited by CVD, PVD, ALD, or another deposition technique. The one or more mask layers are patterned to have the mask opening 54 to thereby form the mask 52. The one or more mask layers may be patterned using photolithography and etch processes, as previously described. The mask opening 54 exposes at least a section of a replacement gate structure between a pair of gate cut-fill structures 50, which section of the replacement gate structure will be removed. As illustrated in FIG. 10A, the mask 52 overhangs a section of a replacement gate structure that is to be removed; although in some instances, the mask opening 54 may be aligned with sidewalls of gate cut-fill structures 50 defining the section of the replacement gate structure that is to be removed.

Figure 11A:
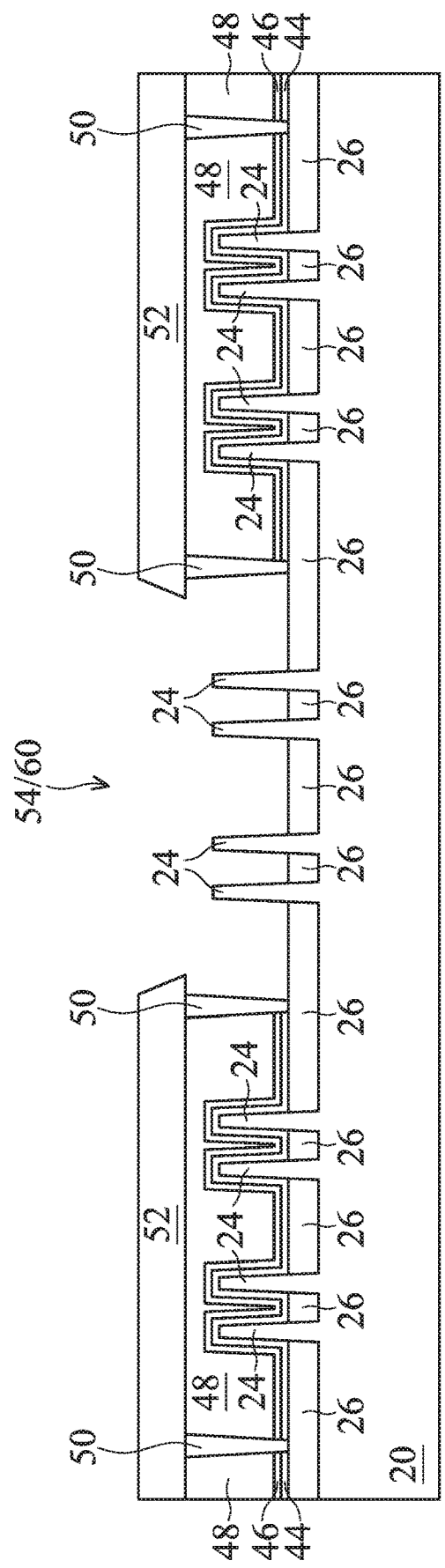
Figure 11B:
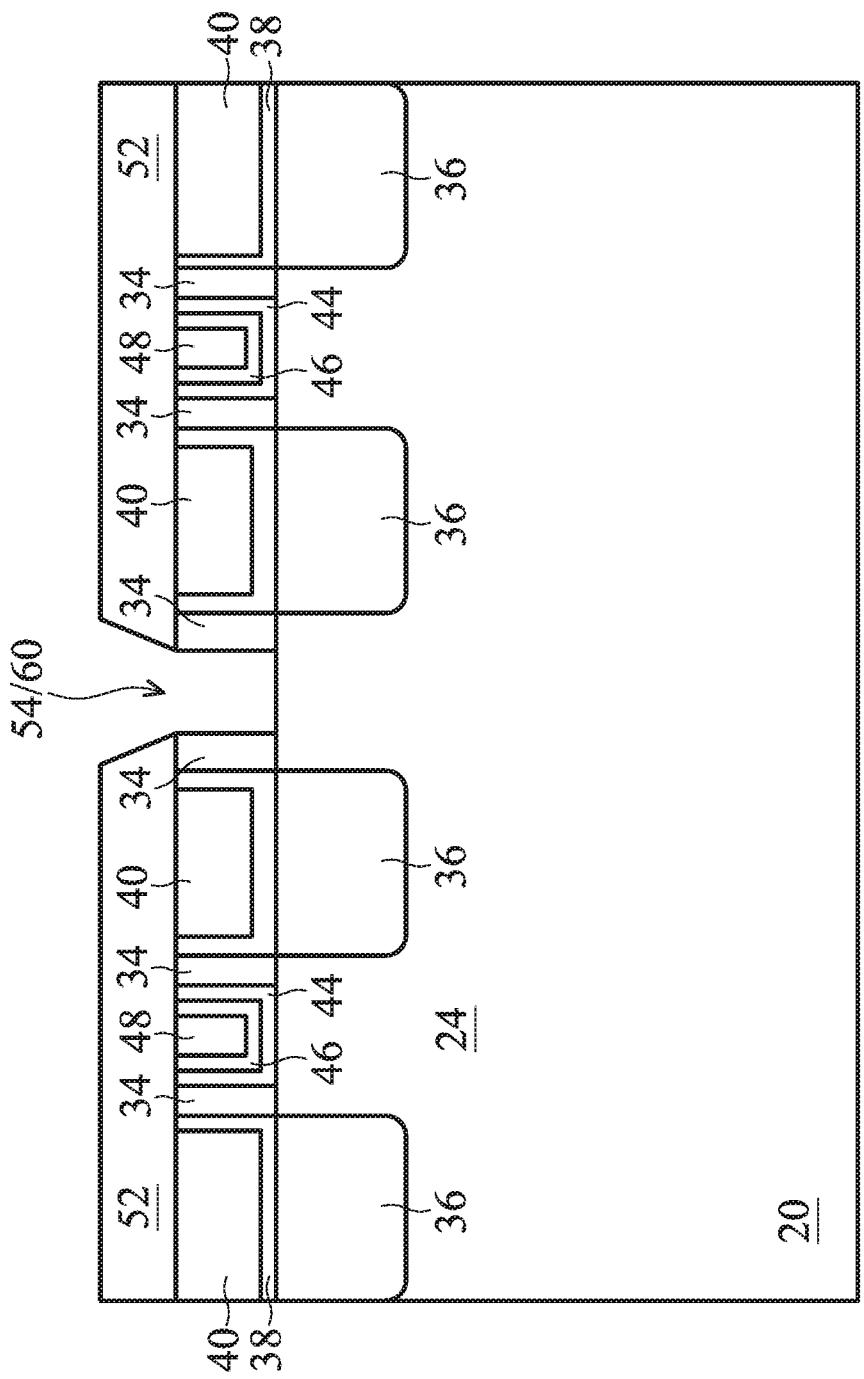
Figure 11C:
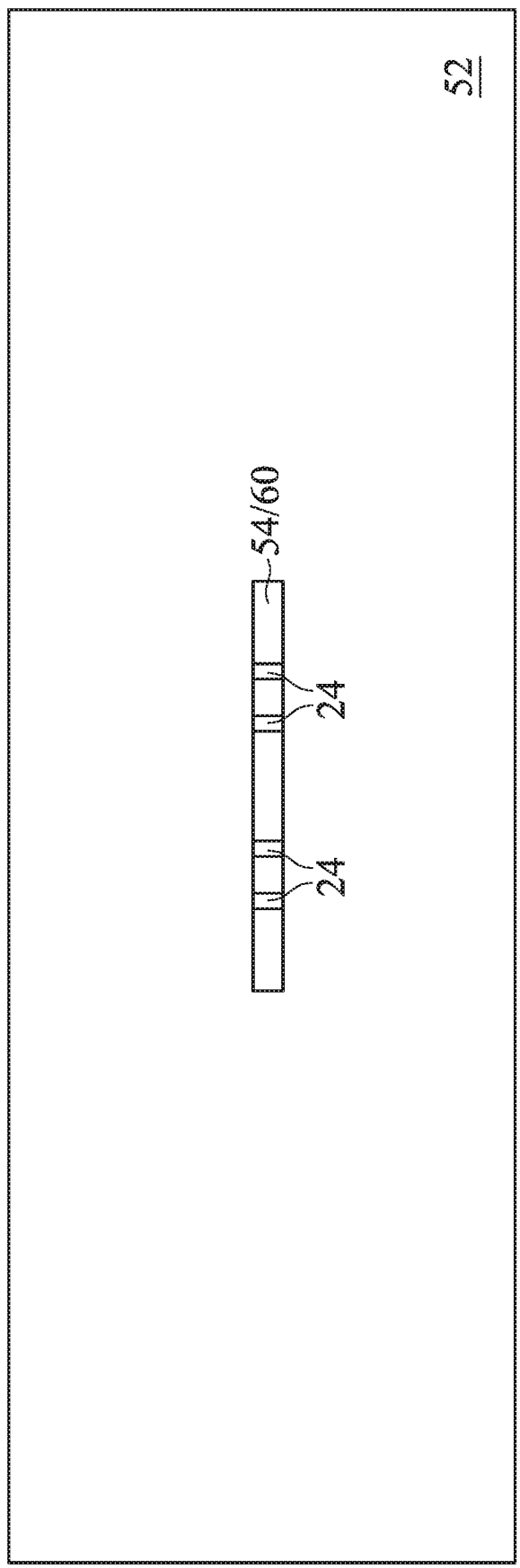

FIGS. 11A, 11B, and 11C illustrate the removal of the section of the replacement gate structure, at least a portion of which is exposed through the mask opening 54. The removal can be by one or more etch processes. The etch processes can be isotropic and selective of the materials of the gate electrode 48, one or more optional conformal layers 46, and gate dielectric layer 44.

For example, the one or more etch processes can be a wet etch process, such as including a sulfuring peroxide mix (SPM) (e.g., a mixture of $H_2SO_4$ and $H_2O_2$), a high temperature standard clean 1 (SC1) (e.g., a mixture of $NH_4OH$, $H_2O_2$, and $H_2O$), or another etch process. A temperature for a wet etch process using SPM may be in a range from about 60° C. to about 200° C., and a temperature for a wet etch process using a high temperature SC1 may be in a range from about 20° C. to about 80° C.

The one or more etch processes can also be a dry (e.g., plasma) etch process. For example, a plasma etch process may implement a low DC substrate bias (e.g., less than about 0.1 kV) or no substrate bias. The plasma etch process may include a RIE, NBE, ICP etch, the like, or a combination thereof. Example etchant gases that can be used for a plasma etch process include boron trichloride ($BCl_3$), silicon tetrachloride ($SiCl_4$), chlorine ($Cl_2$), other Cl-based gases, the like, or a combination thereof. A flow rate of the etchant gas(es) of a plasma etch process may be in a range from about 50 sccm to about 800 sccm. A power of a plasma etch process may be in a range from about 200 W to about 1,000 W. A pressure of a plasma etch process may be in a range from about 1 mTorr to about 80 mTorr.

With an isotropic etch selective to the materials of the gate electrode 48, one or more optional conformal layers 46, and gate dielectric layer 44, the section of the replacement gate structure that has at least a portion exposed through the mask opening 54 can be removed, even portions that may be underlying the mask 52, e.g., due to misalignment. The removal of the section of the replacement gate structure forms a gate cut opening 60 between the gate spacers 34 and gate cut-fill structures 50 along the section of the replacement gate structure that was removed. The gate cut opening 60 exposes portions of fins 24 where the fins 24 will be cut.

Figure 12A:
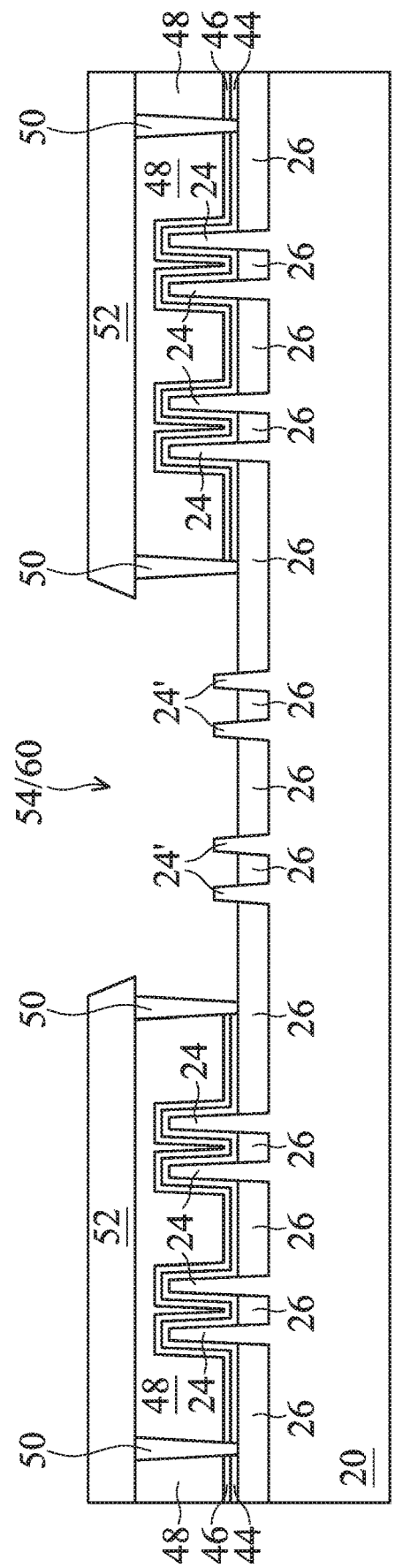
Figure 12B:
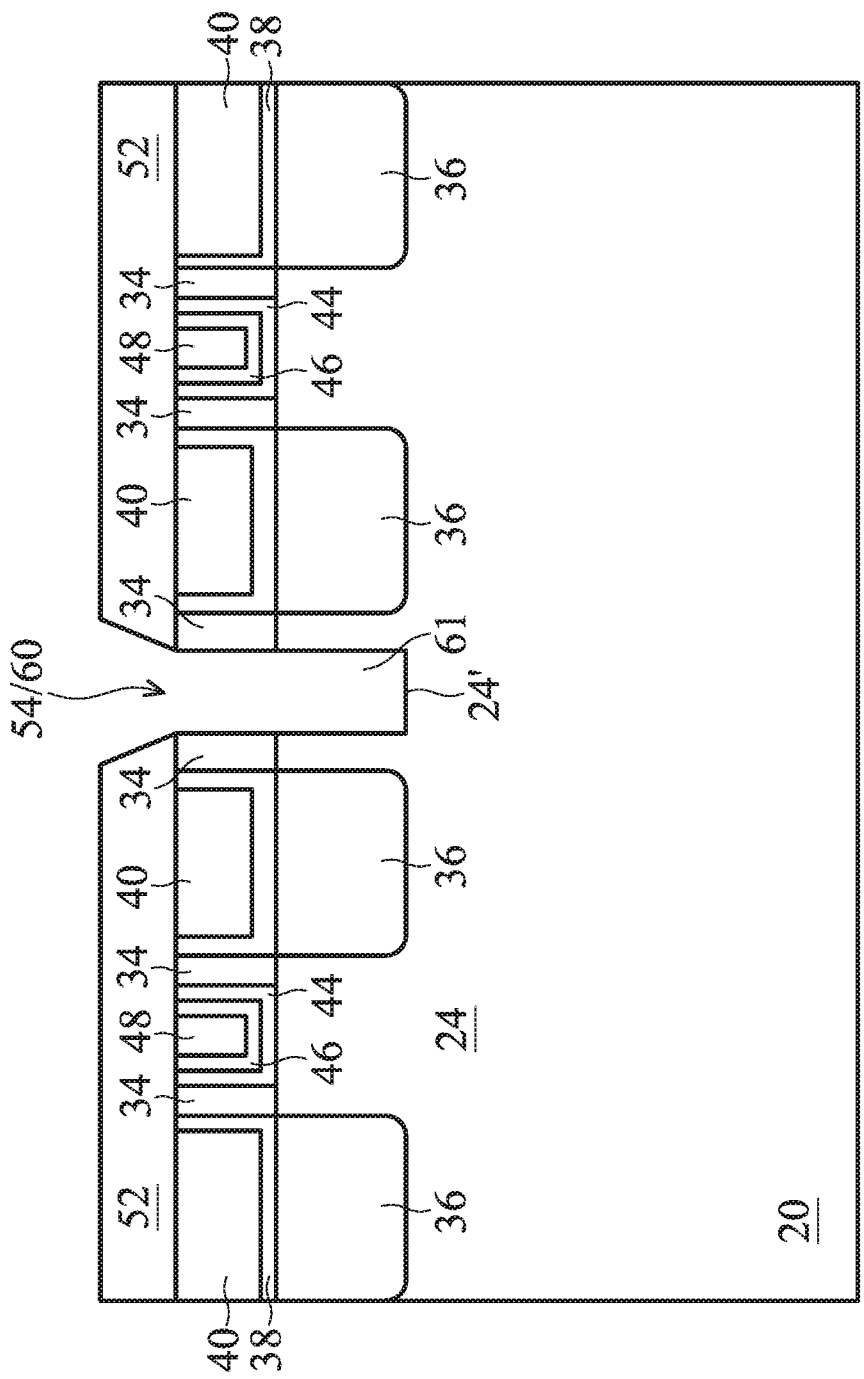
Figure 12C:
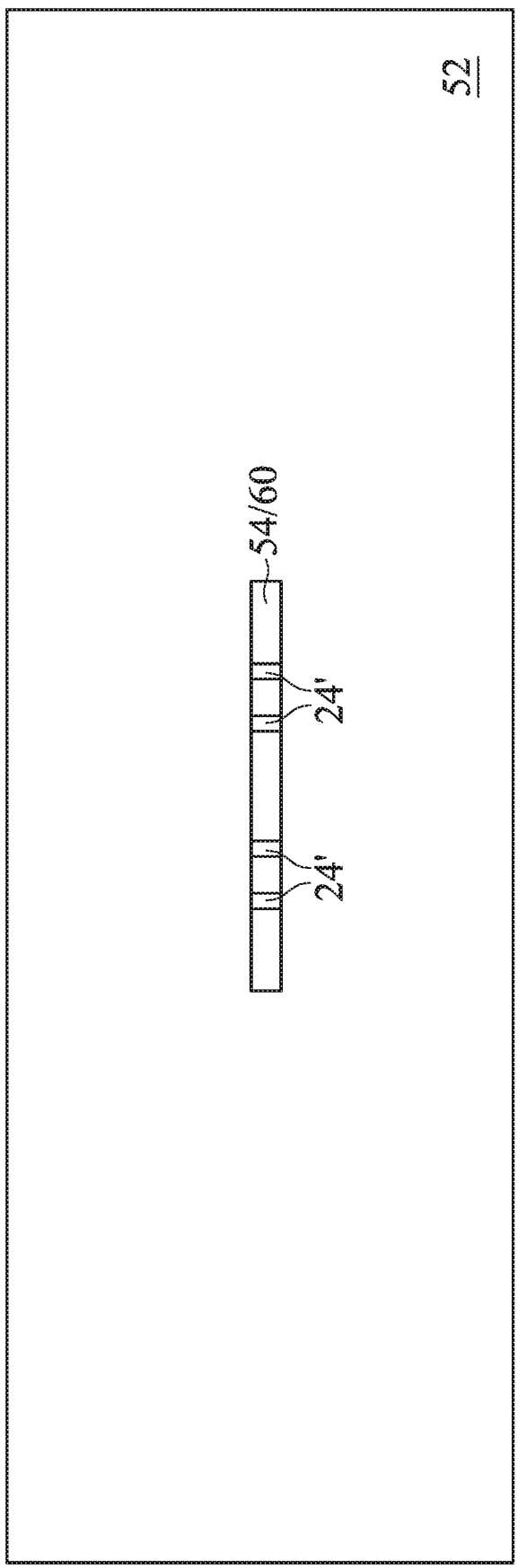

FIGS. 12A, 12B, and 12C illustrate the trimming of fins 24 exposed through the mask opening 54 through the mask 52 and exposed through the gate cut opening 60 where the section of the replacement gate structure was removed. The trimming forms trimmed fins 24' with a trim cut 61. The trimming can be by one or more etch processes. The etch process can be isotropic and/or anisotropic and selective of the material of the fins 24.

For example, the etch process can be a dry (e.g., plasma) etch process. A plasma etch process can implement some DC substrate bias, such as in a range from about 0 kV to about 0.1 kV. The plasma etch process may include a RIE, NBE, ICP etch, the like, or a combination thereof. Example etchant gases that can be used in a plasma etch process include hydrogen bromide (HBr), chlorine ($Cl_2$), silicon tetrachloride ($SiCl_4$), boron trichloride ($BCl_3$), other chlorine-based gases, the like, or a combination thereof. A flow rate of the etchant gas(es) of a plasma etch process may be in a range from about 50 sccm to about 800 sccm. A power of a plasma etch process may be in a range from about 200 W to about 1,000 W. A pressure of a plasma etch process may be in a range from about 1 mTorr to about 80 mTorr.

In some examples, the top surfaces of the trimmed fins 24' are at or above top surfaces of respective neighboring isolation regions 26. For example, the trim cut 61 can have a depth from a top surface of the fin 24 in a range from about 20 nm to about 80 nm from a top surface of the fins 24. The depth of the trim cut 61 can be less than, equal to, or greater than a depth of a recess in which the epitaxy source/drain region 36 is formed, where the depth of the recess is from a top surface of the fin 24. In some specific examples, the depth of the trim cut 61 is equal to or greater than the depth of a recess in which the epitaxy source/drain region 36 is formed.

As seen in the cross-sectional view of FIG. 12B, the trimming of the fins 24 causes a trim cut 61 (corresponding to the gate cut opening 60) to extend to a depth between sidewalls of a respective fin 24. A material of the fin 24 (e.g., the stressed semiconductor layer 22) forms the sidewall where the fin 24 was trimmed, and the material of the fin 24 (e.g., the stressed semiconductor layer 22, which is a crystalline material) is disposed between the sidewall and a corresponding epitaxy source/drain region 36. For example, the material of the fin 24 below each of the gate spacers 34 between which the trim cut 61 is defined is disposed between a corresponding epitaxy source/drain region 36 and sidewall of the trim cut 61. Hence, a crystalline material may be disposed between the epitaxy source/drain region 36 and a corresponding sidewall of the trim cut 61.

Figure 13A:
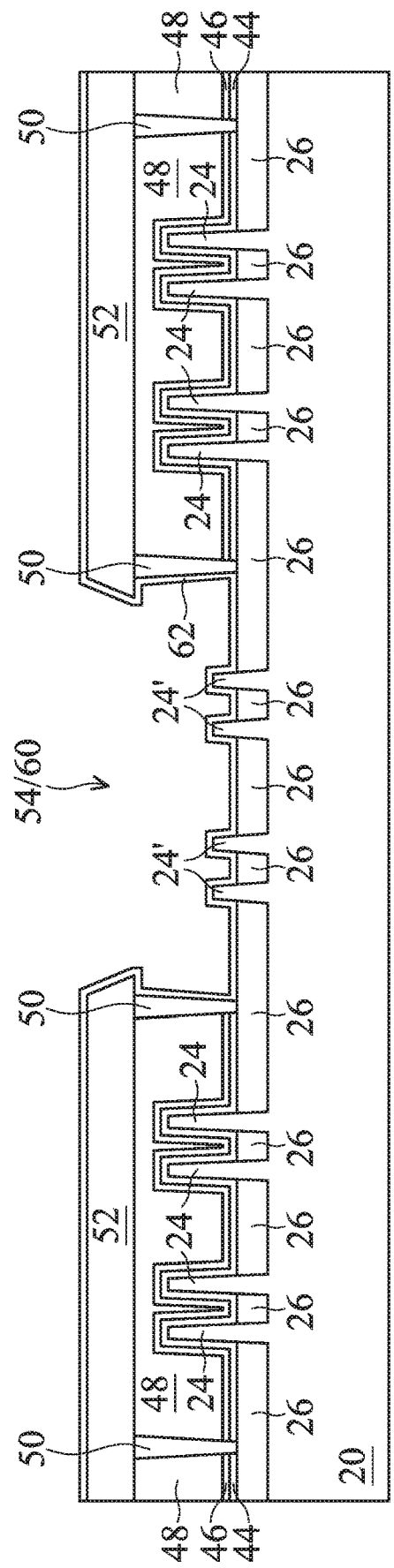
Figure 13B:
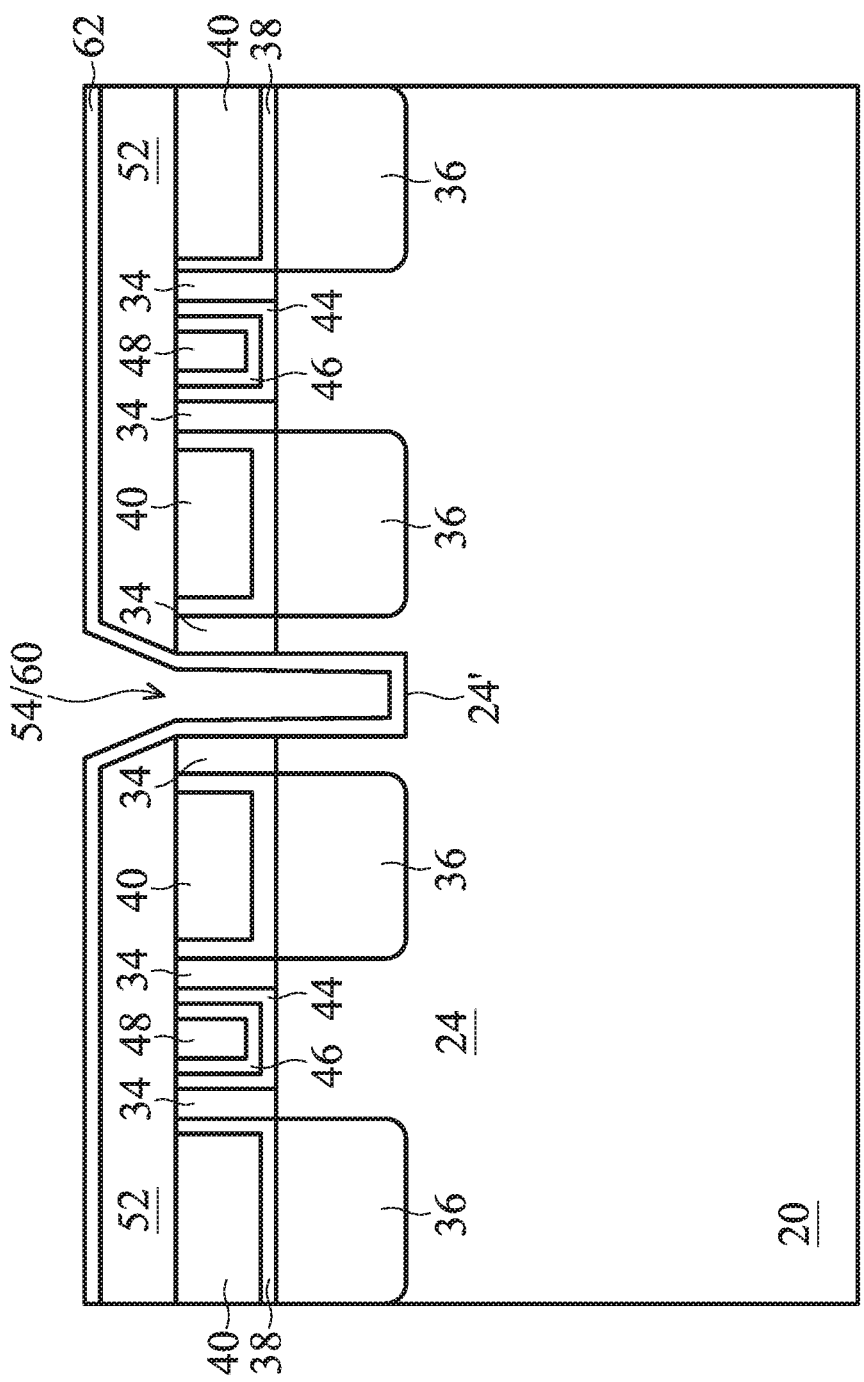
Figure 13C:
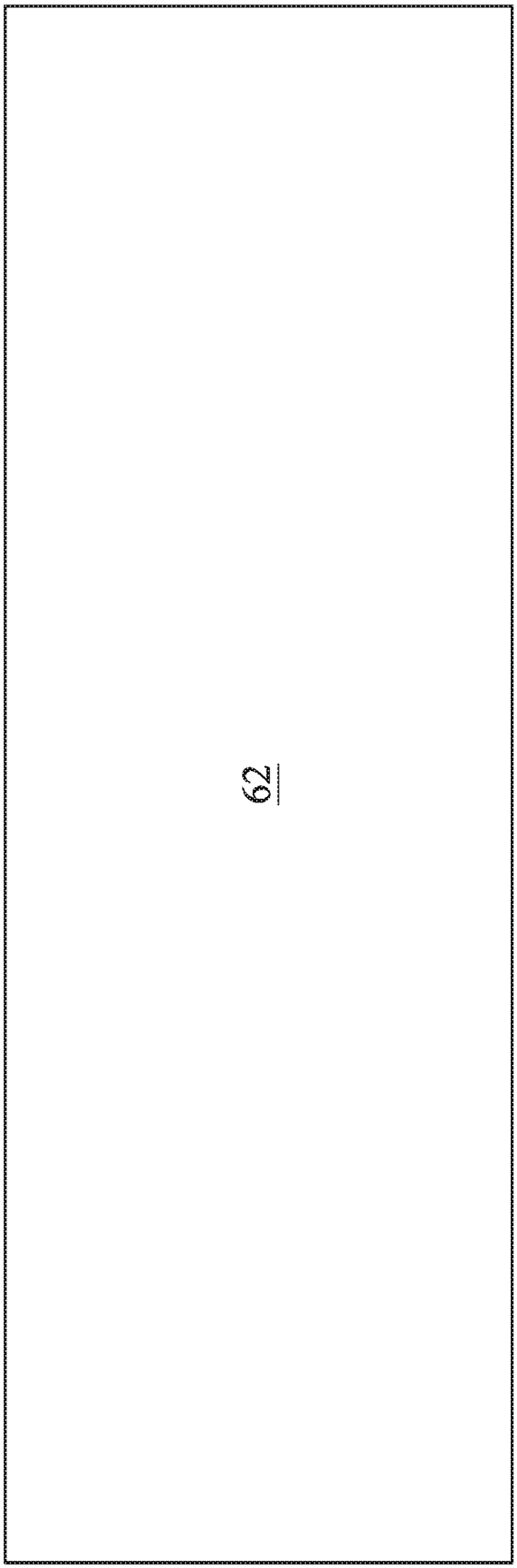

FIGS. 13A, 13B, and 13C illustrate the formation of a liner 62 in the gate cut opening 60 where the second of the replacement gate structure was removed and in the trim cut 61 on the trimmed fins 24'. The liner 62 is conformally deposited in the gate cut opening 60, in the trim cut 61, and on the mask 52. For example, the liner 62 is conformally deposited on sidewalls of the gate spacers 34 and trimmed fins 24' (e.g., as shown in FIG. 13B), on upper surfaces of the trimmed fins 24' (e.g., as shown in FIGS. 13A and 13B), and on sidewalls of the gate cut-fill structures 50 and top surfaces of isolation regions 26 (e.g., as shown in FIG. 13A). The liner 62 can be or include silicon nitride, silicon oxide, silicon oxynitride, silicon carbon nitride, the like, or a combination thereof, and may be deposited by ALD, CVD, or another conformal deposition technique. A thickness of the liner 62 can be in a range from about 1 nm to about 5 nm.

Figure 14A:
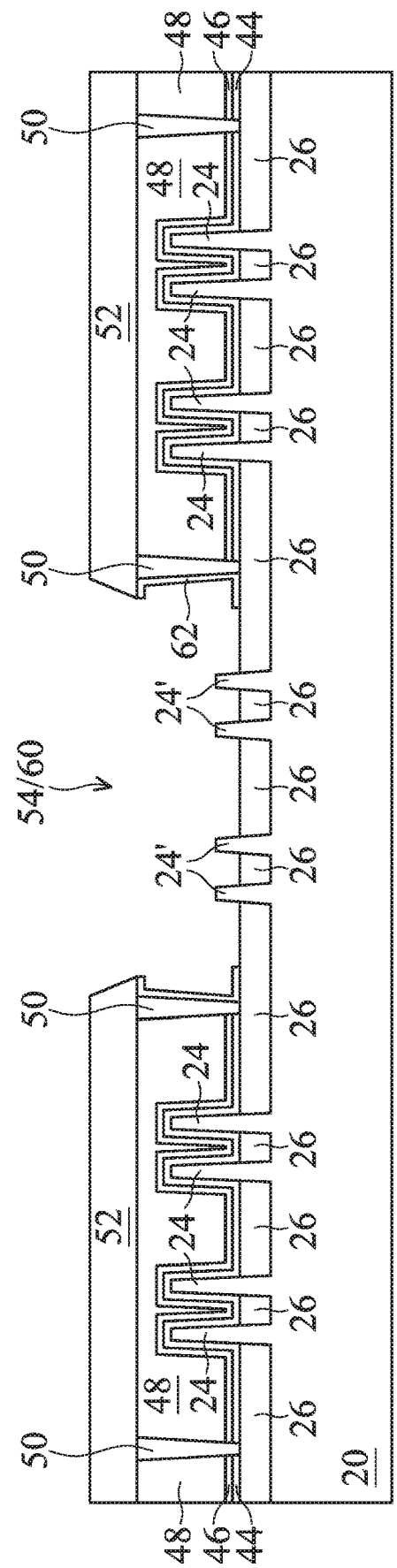
Figure 14B:
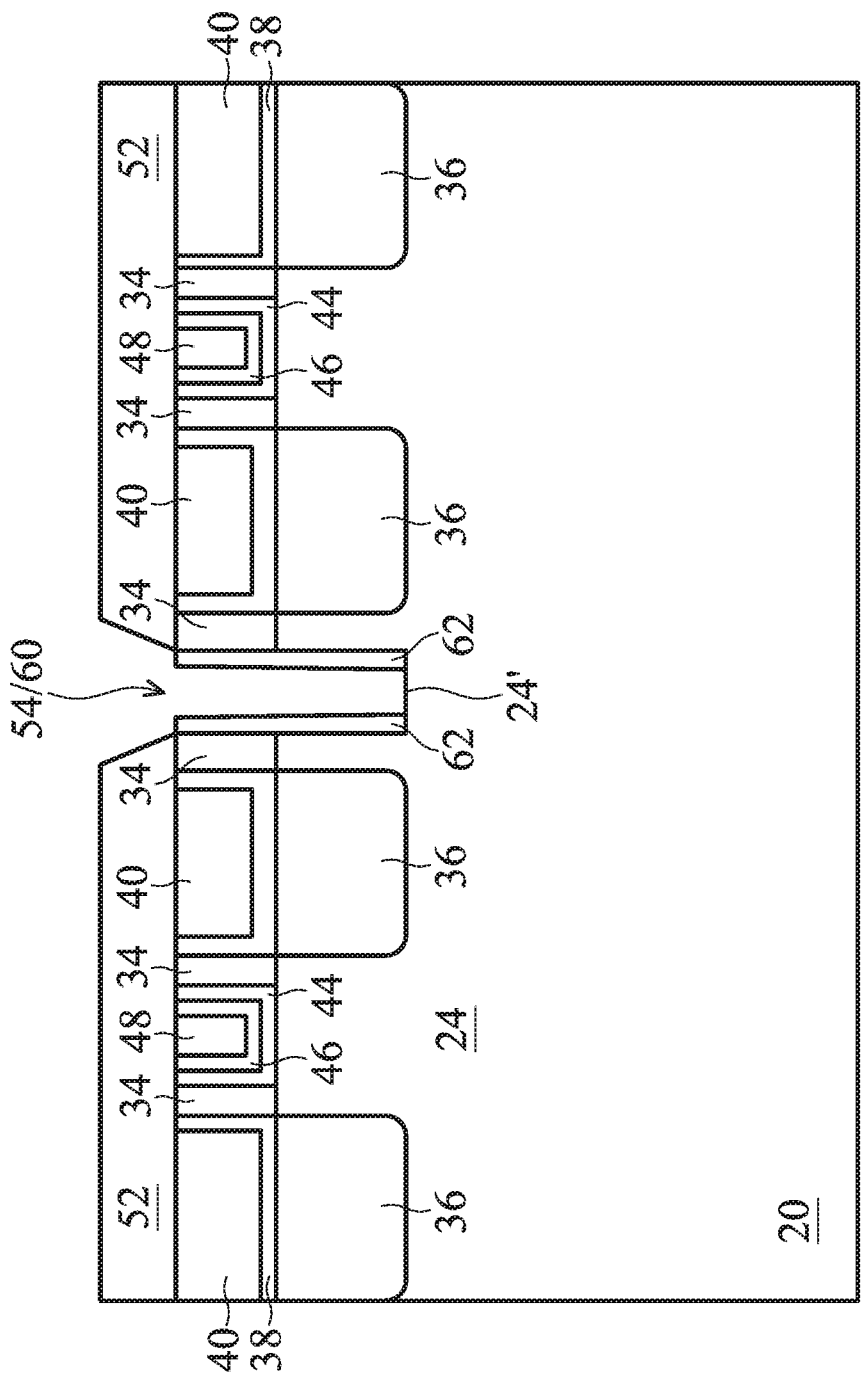
Figure 14C:
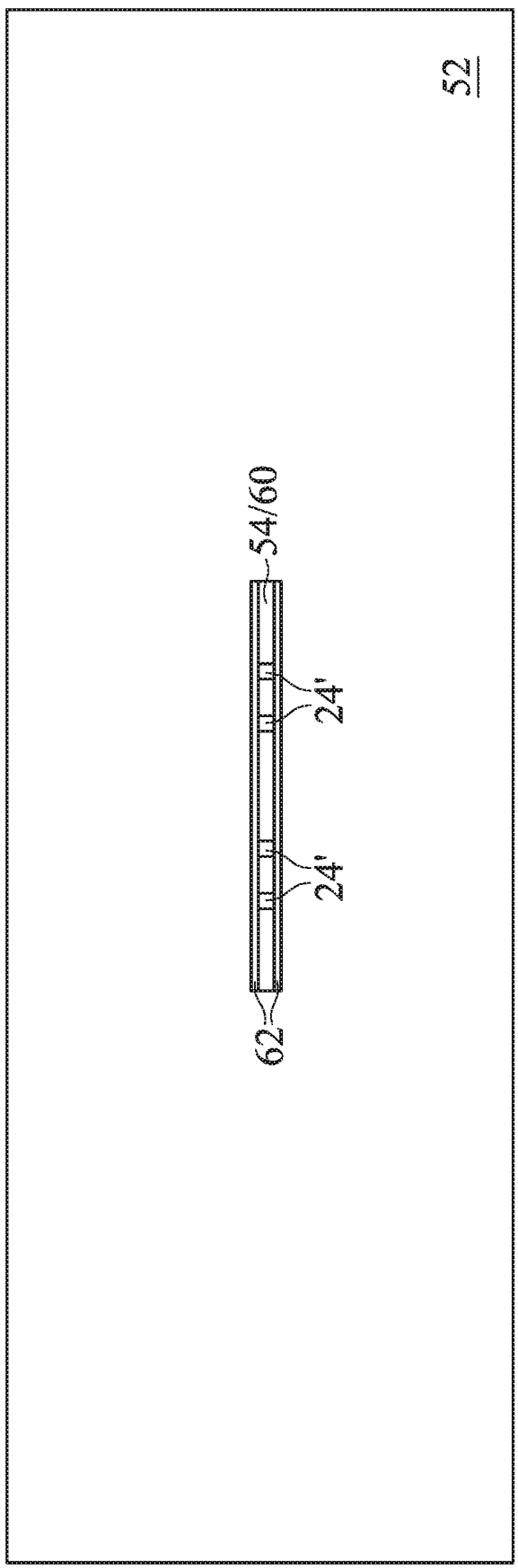

FIGS. 14A, 14B, and 14C illustrate a break through etch process performed on the liner 62 to expose where the trimmed fins 24' are to be further cut. The break through etch process can be an anisotropic etch process, such as a dry (e.g., plasma) etch process. An anisotropic etch process can be a RIE, ICP, NBE, or the like. Example etchant gases can be or include chlorine ($Cl_2$), a chlorine-based gas, fluoroform ($CHF_3$), tetrafluoromethane ($CF_4$), a carbon-containing polymer (e.g., containing —$CH_2$, —$CH_3$, etc.), sulfur hexafluoride ($SF_6$), nitrogen trifluoride ($NF_3$), or the like, or a combination thereof. A flow rate of the etchant gas(es) of a plasma etch process may be in a range from about 50 sccm to about 800 sccm. A plasma etch process may implement a DC substrate bias greater than or equal to about 0.1 kV, such as in a range from about 0.1 kV to about 0.8 kV. A power of a plasma etch process may be in a range from about 200 W to about 1,000 W. A pressure of a plasma etch process may be in a range from about 1 mTorr to about 80 mTorr.

The anisotropic etch process exposes the trimmed fins 24' while permitting the liner 62 to remain along sidewalls of the fins 24 in the trim cut 61 and along sidewalls of the gate spacers 34, such as shown in FIG. 14B. Portions of the liner 62 that are not exposed to the anisotropic etch process, such as along sidewalls of the gate cut-fill structures 50 and beneath overhangs of the mask 52, also remain in the gate cut opening 60. As seen in the cross-sectional view of FIG. 14B, the material of the fin 24 (e.g., the stressed semiconductor layer 22, which is a crystalline material) is disposed between the liner 62 that remains after the break through etch process and a corresponding epitaxy source/drain region 36. Hence, a crystalline material may be disposed between the epitaxy source/drain region 36 and a corresponding liner 62.

Figure 15A:
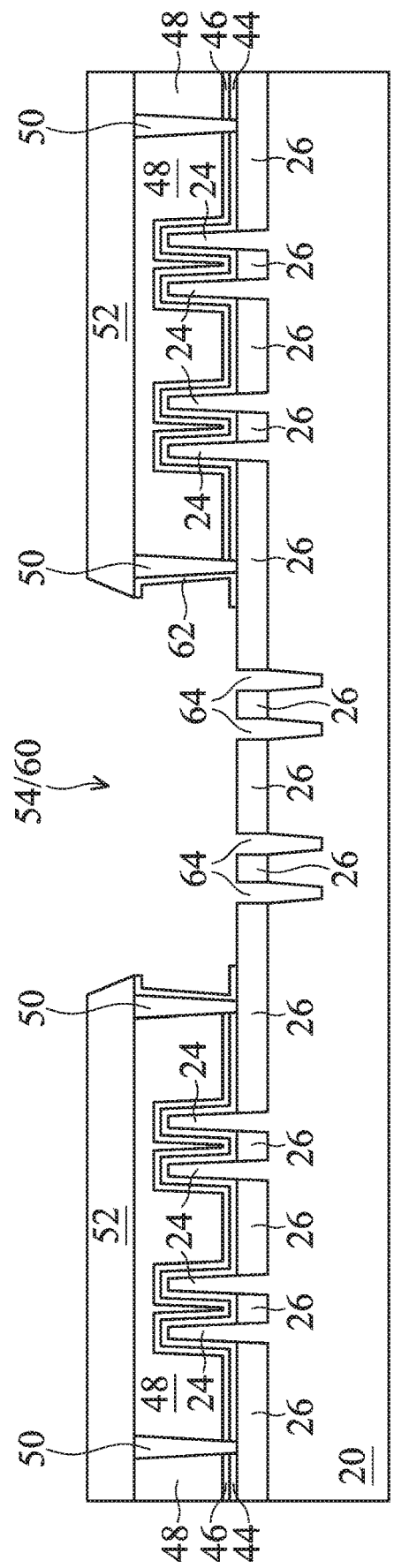
Figure 15B:
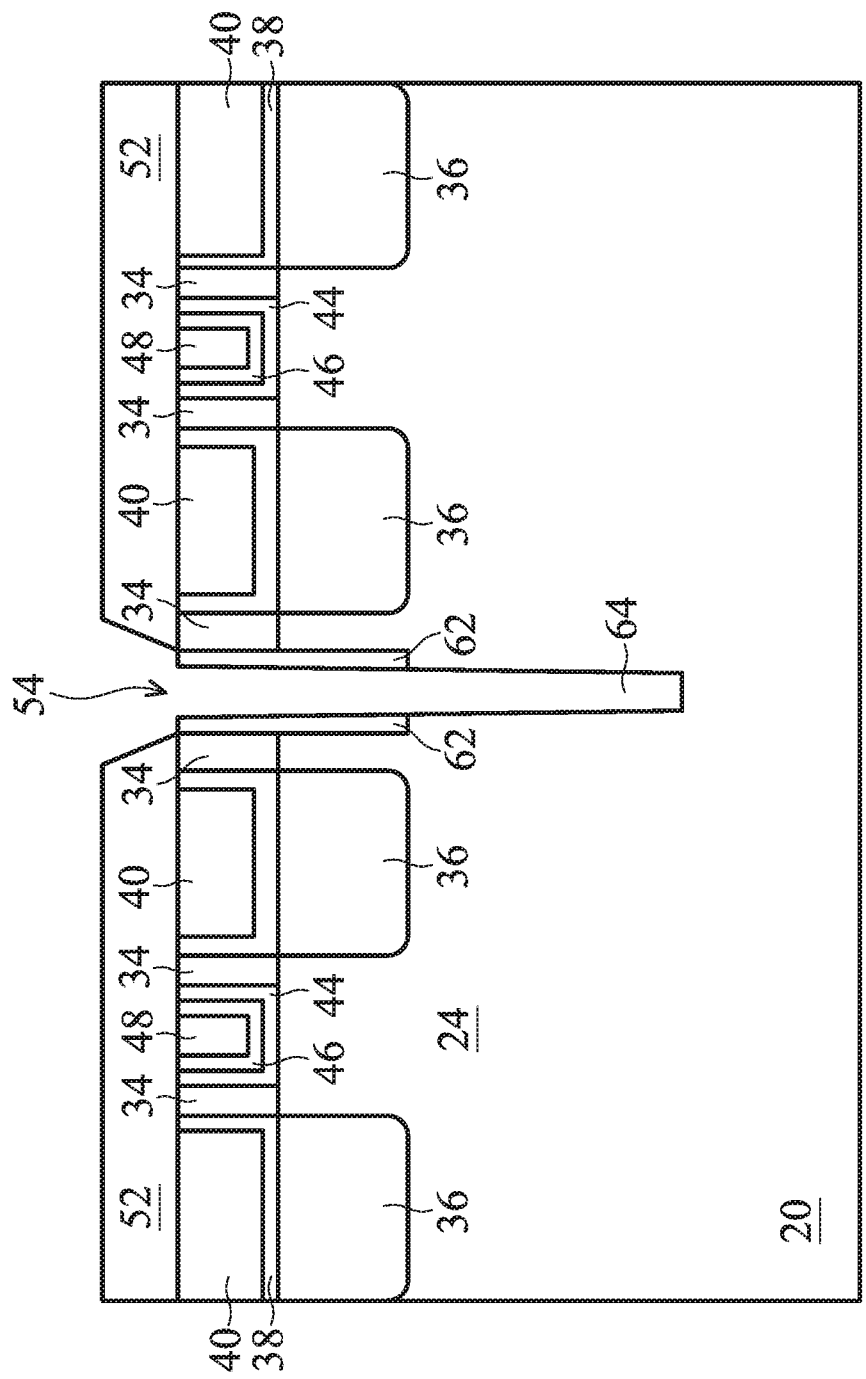
Figure 15C:
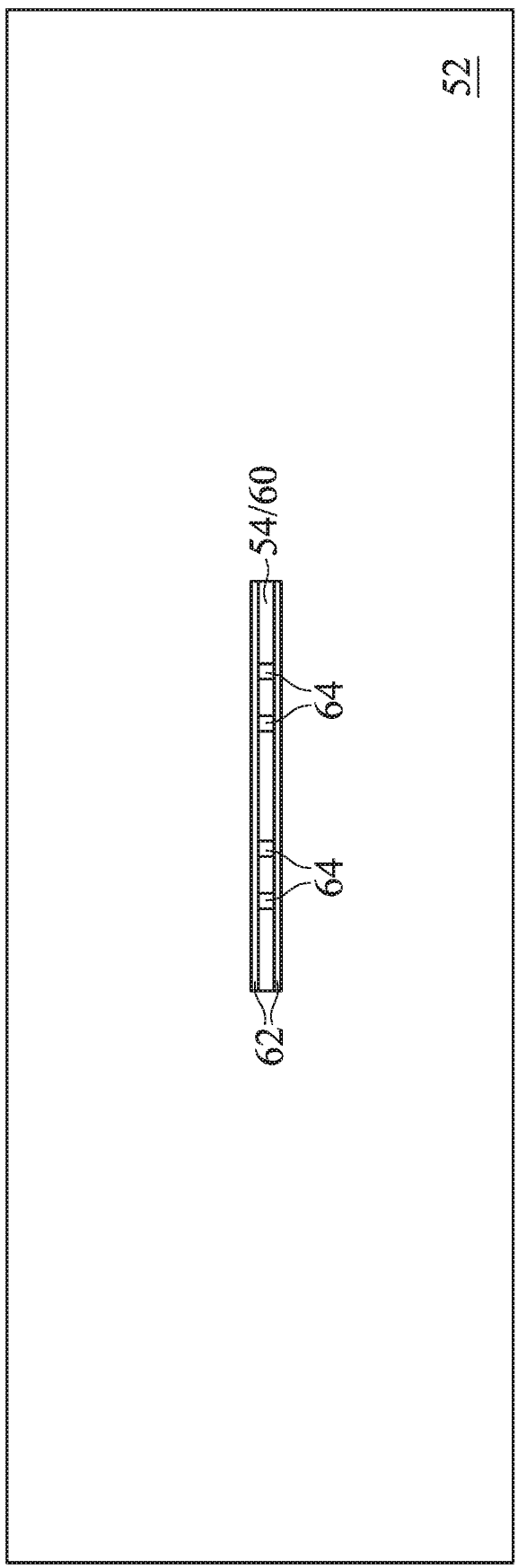

FIGS. 15A, 15B, and 15C illustrate the cutting of fins 24 exposed through the liner 62, through the mask opening 54 through the mask 52, and through the gate cut opening 60 where the section of the replacement gate structure was removed. The cutting of the fins 24 removes portions of the fins 24 exposed through the liner 62 and openings 54 and 60 and between corresponding isolation regions 26 and removes portions of the semiconductor substrate 20 where the fins 24 are cut to a level below the isolation regions 26 to form recesses 64 in the semiconductor substrate 20. The cutting of the fins 24 may be by using an etch process. The etch process may be anisotropic or isotropic and selective to the materials of the fins 24 and semiconductor substrate 20.

For example, the etch process can be a dry (e.g., plasma) etch process. A plasma etch process can implement some DC substrate bias, such as in a range from about 0.1 kV to about 1 kV. The plasma etch process may include a RIE, NBE, ICP etch, the like, or a combination thereof. Example etchant gases that can be used in a plasma etch process include hydrogen bromide (HBr), chlorine ($Cl_2$), silicon tetrachloride ($SiCl_4$), boron trichloride ($BCl_3$), other chlorine-based gases, the like, or a combination thereof. A flow rate of the etchant gas(es) of a plasma etch process may be in a range from about 50 sccm to about 800 sccm. A power of a plasma etch process may be in a range from about 50 W to about 1,000 W. A pressure of a plasma etch process may be in a range from about 1 mTorr to about 80 mTorr.

The liner 62 on the sidewalls of the cut fins 24 can protect, e.g., the epitaxy source/drain regions 36 during the cutting of the fins 24. Further, the liner 62 can define a region of the trimmed fin 24' that is cut. A width of the trimmed fin 24' that is cut may be a distance between facing sidewalls of the liner 62, for example, which is less than a width of the trim cut 61 of FIG. 12B. Since the liner 62 defines the width of the region that is cut, other process windows may be increased. For example, a width of a dummy gate stack corresponding to the section of the replacement gate structure that is removed can be increased. Also, due to the trimming, liner 62 formation, and cutting, the cut fins 24 have a step formed at a bottom of the liner 62, as described in further detail below.

Figure 16A:
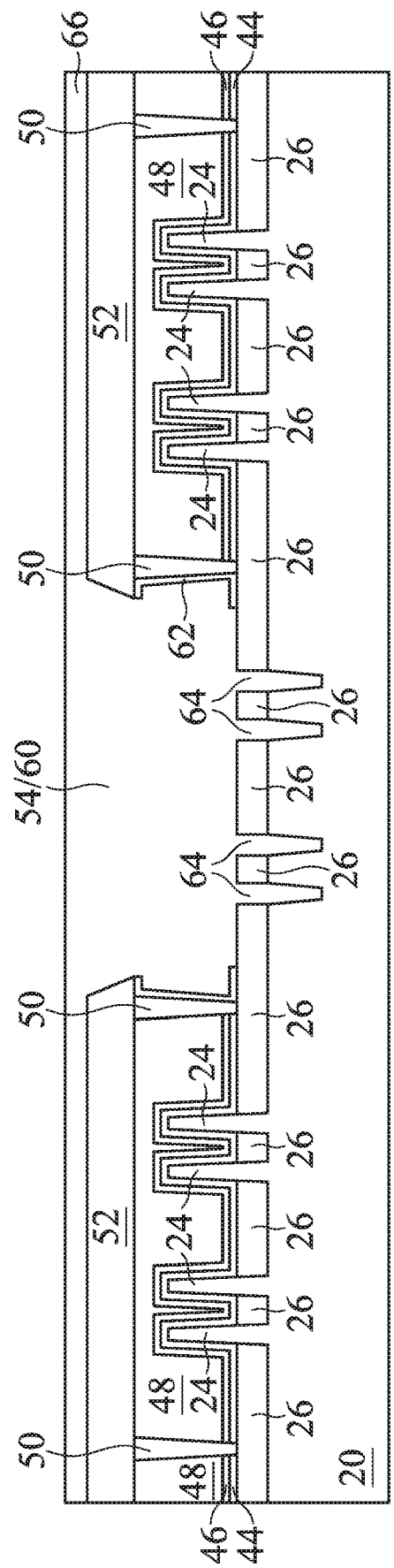
Figure 16B:
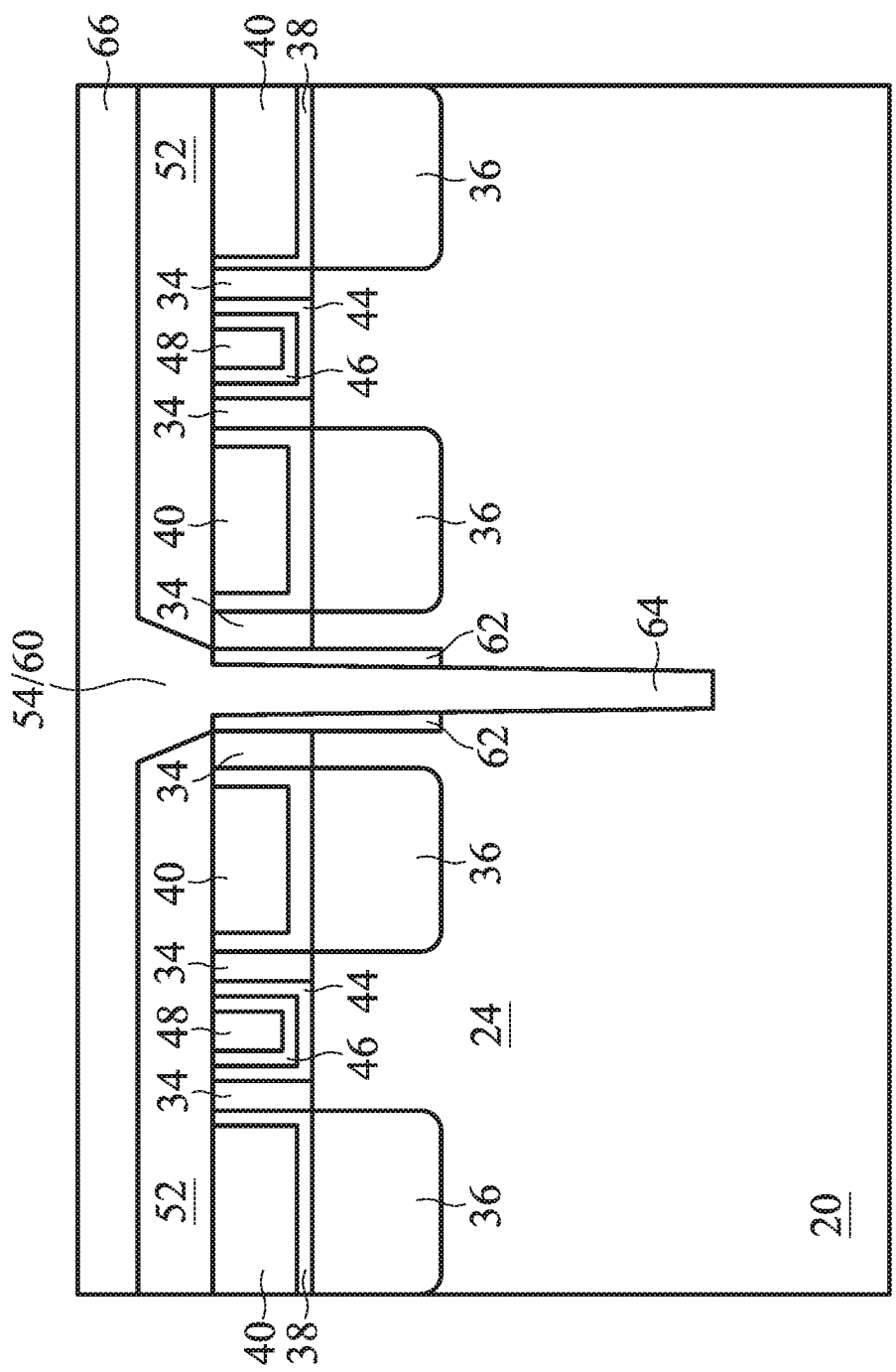
Figure 16C:
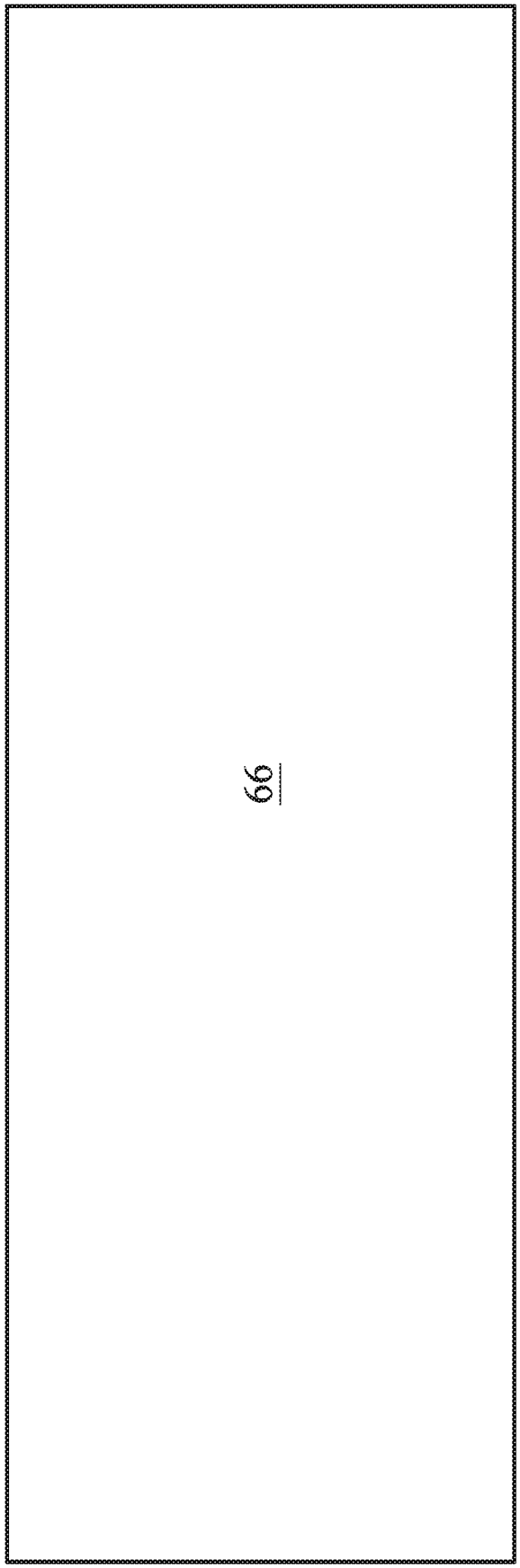

FIGS. 16A, 16B, and 16C illustrate the formation of a fill material 66 in the gate cut opening 60 where the section of the replacement gate structure was removed and in the recesses 64. The fill material 66 may be an insulating material. In some examples, fill material 66 may be a single insulating material, and in other examples, fill material 66 may include multiple different insulating materials, such as in a multi-layered configuration. The fill material 66 may include or be silicon oxide, silicon nitride, silicon oxynitride, silicon carbide, silicon carbon nitride, the like, or a combination thereof, and may be deposited by CVD, PVD, ALD, or another deposition technique. In some examples, the fill material 66 can be or include the same or different material as the liner 62. In some examples where the fill material 66 and the liner 62 are the same material, a byproduct/residue (e.g., with a different material composition) may be present and/or dangling bonds of the liner 62 may be present at an interface between the liner 62 and fill material 66 due to the etch process of FIGS. 15A-C.

Figure 17A:
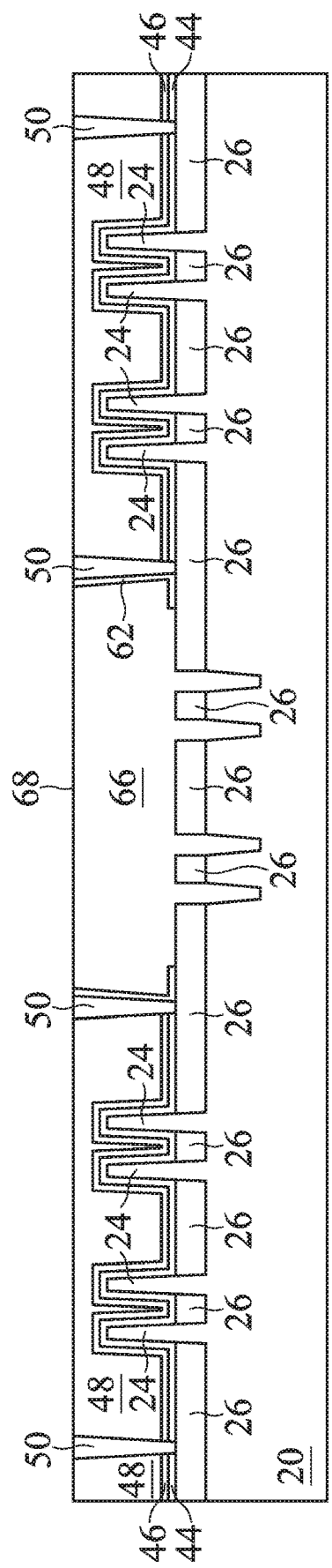
Figure 17B:
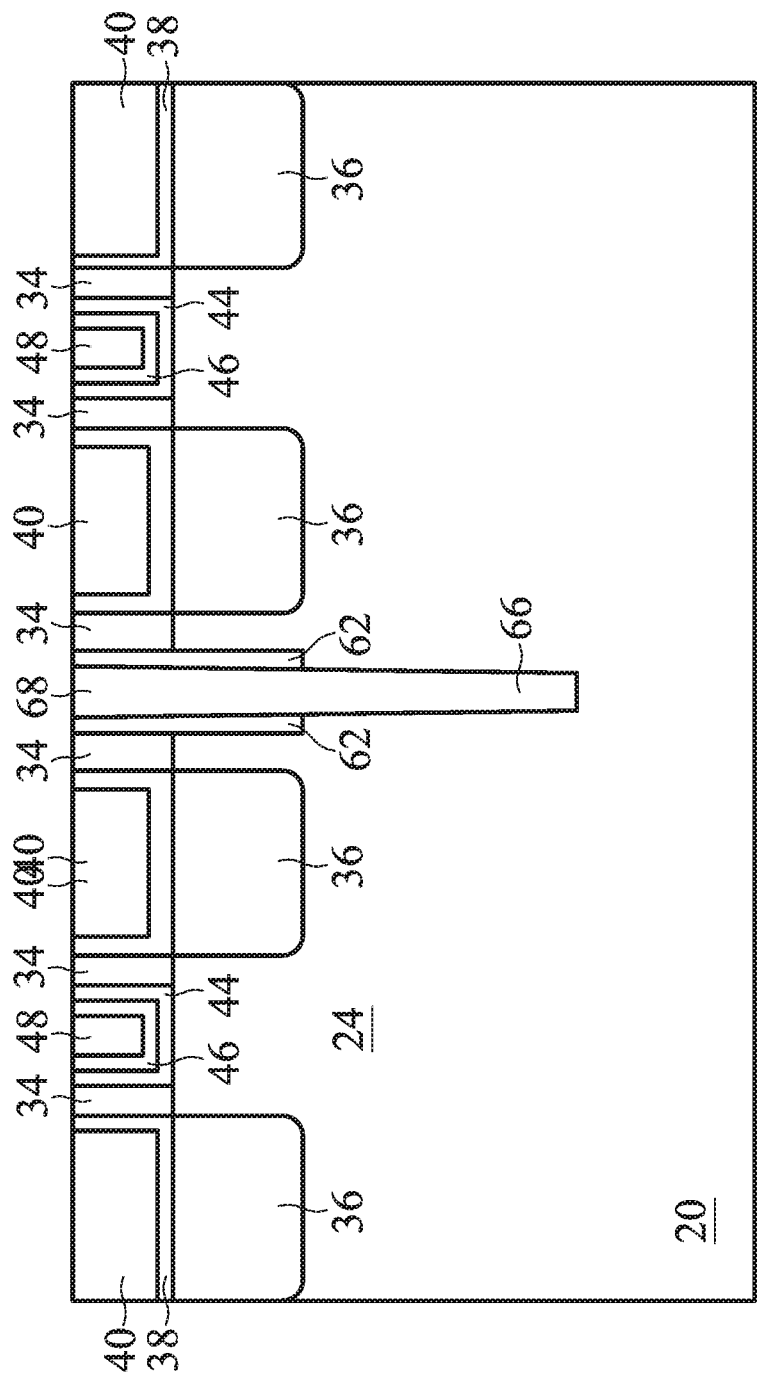
Figure 17C:
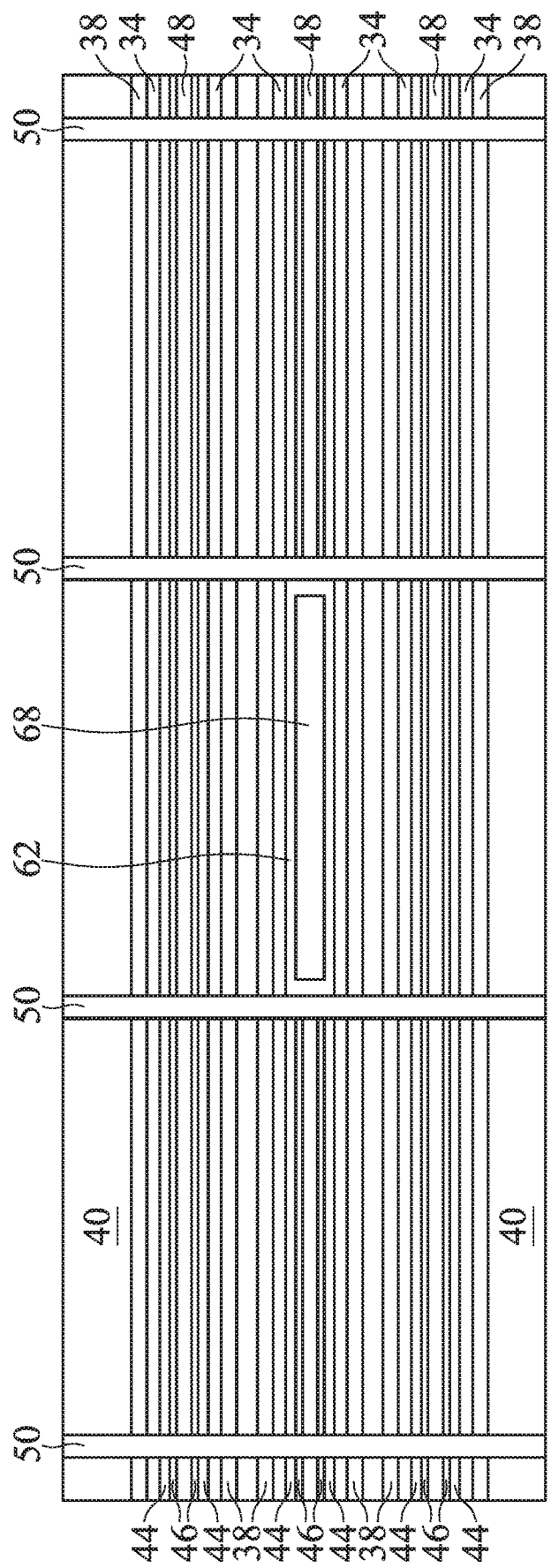

FIGS. 17A, 17B, and 17C illustrate the planarization of the fill material 66 with top surfaces of the first ILD 40, ESL 38, gate cut-fill structures 50, gate spacers 34, and replacement gate structures to form a fin cut-fill structure 68 including the fill material 66 and the liner 62. Portions of the fill material 66 and the mask 52 above the top surfaces of the first ILD 40, etc., are removed. For example, a planarization process, like a CMP, may remove the portions of the fill material 66 and the mask 52 above the top surfaces of the first ILD 40, etc., and top surfaces of the fill material 66 may be formed coplanar with the top surfaces of the first ILD 40, ESL 38, gate cut-fill structures 50, gate spacers 34, and replacement gate structures. The fin cut-fill structure 68 therefore electrically isolates sections of the cut fins 24 that were cut from each other. It is noted that the replacement gate structures, gate spacers 34, ESL 38, first ILD 40, and gate cut-fill structures 50 may experience some loss due to the planarization process. For example, as illustrated, portions of the liner 62 that over-hanged the gate cut opening 60 (e.g., were deposited on undersurfaces of the mask 52) may be removed by the planarization process, which can further result in loss of height of the gate cut-fill structures 50, first ILD 40, replacement gate structures, etc.

Figure 18A:
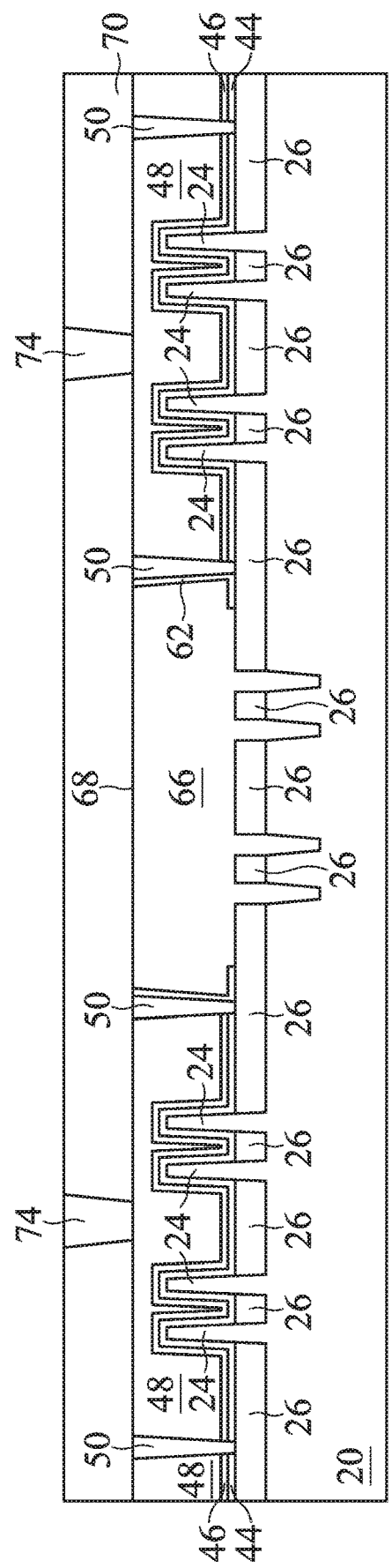
Figure 18B:
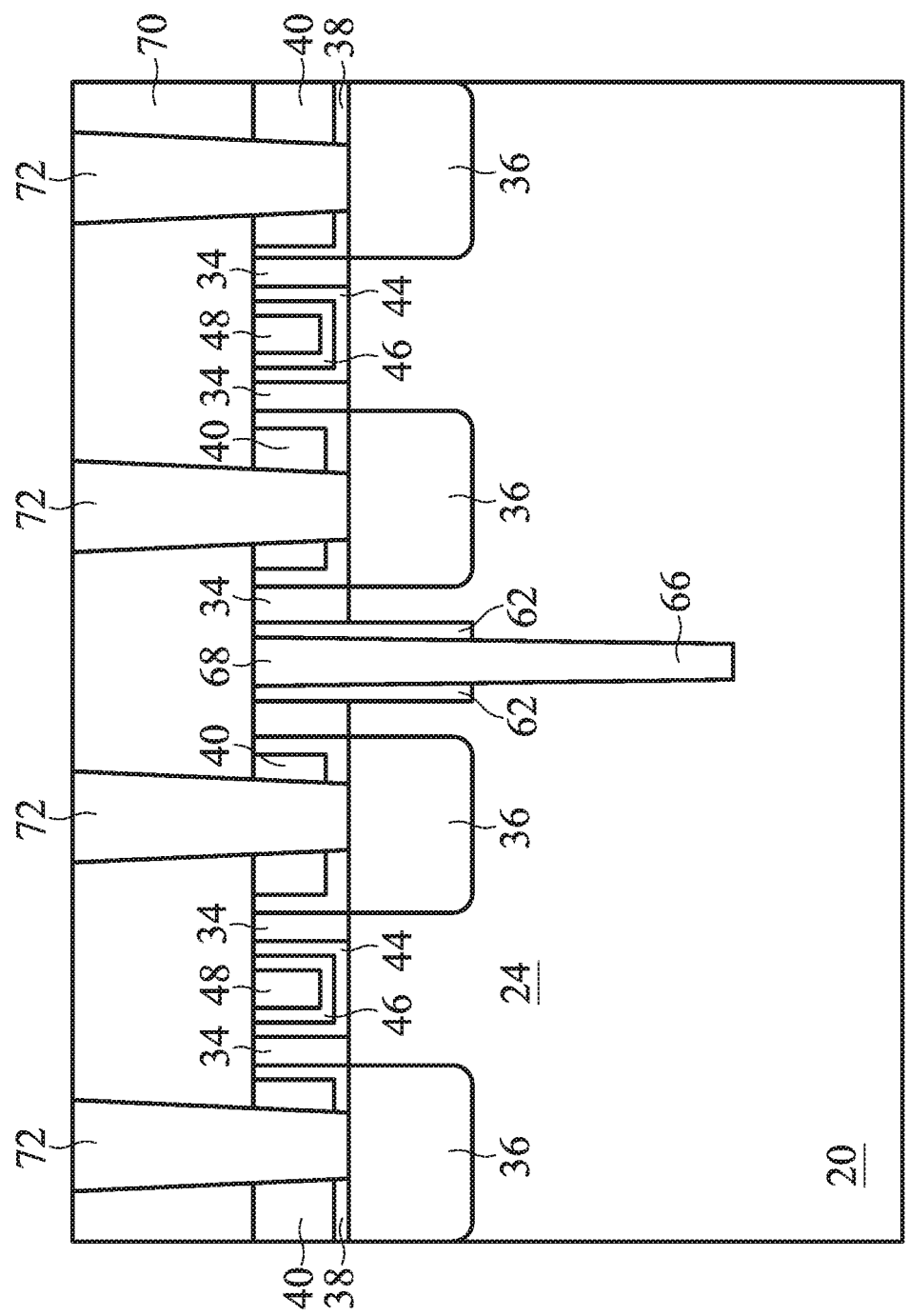
Figure 18C:
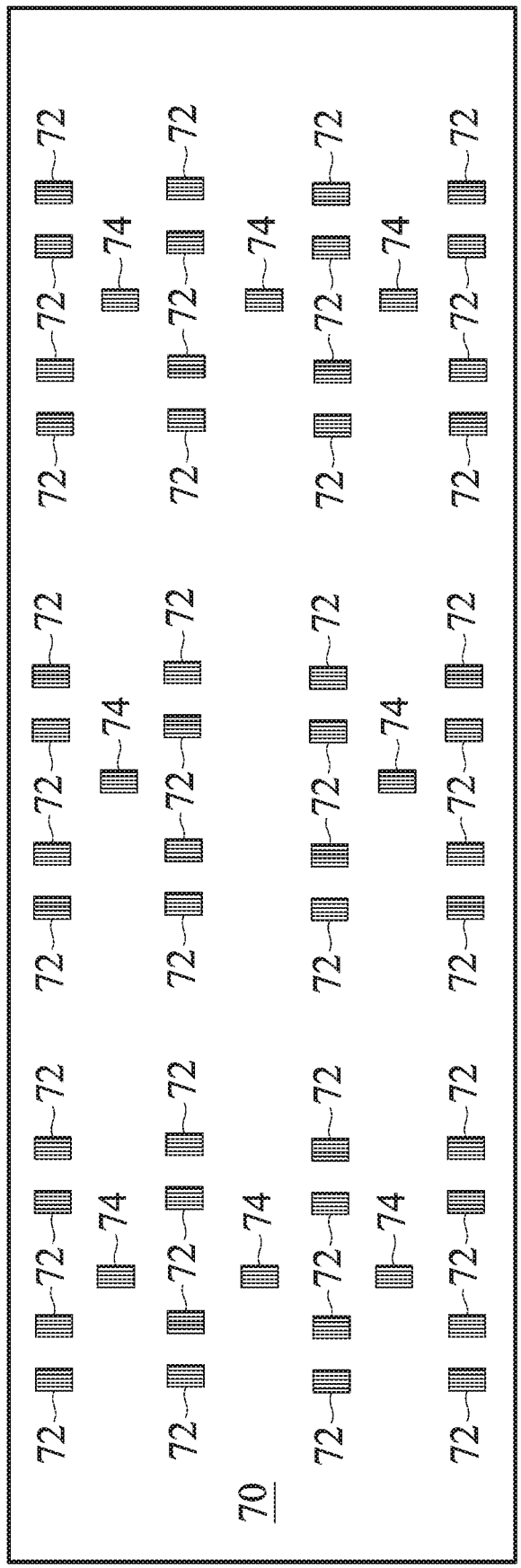

FIGS. 18A, 18B, and 18C illustrate the formation of a second ILD 70 and conductive features 72 and 74 through the second ILD 70, first ILD 40, and/or ESL 38 to epitaxy source/drain regions 36 and replacement gate structures. Although not illustrated, an ESL may be deposited over the first ILD 40, ESL 38, gate spacers 34, replacement gate structures, gate cut-fill structures 50, and fin cut-fill structure 68. The ESL may comprise or be silicon nitride, silicon carbon nitride, silicon carbon oxide, carbon nitride, the like, or a combination thereof, and may be deposited by CVD, PECVD, ALD, or another deposition technique. The second ILD 70 is deposited over the ESL, if implemented, and/or over the first ILD 40, ESL 38, gate spacers 34, replacement gate structures, gate cut-fill structures 50, and fin cut-fill structure 68. The second ILD 70 may comprise or be silicon dioxide, a low-k dielectric material, such as silicon oxynitride, PSG, BSG, BPSG, USG, FSG, OSG, $SiO_xC_y$, Spin-On-Glass, Spin-On-Polymers, silicon carbon material, a compound thereof, a composite thereof, the like, or a combination thereof. The second ILD 70 may be deposited by spin-on, CVD, FCVD, PECVD, PVD, or another deposition technique.

Openings for conductive features 72 may be formed through the second ILD 70, first ILD 40, and ESL 38 to the epitaxy source/drain regions 36 to expose at least respective portions of the epitaxy source/drain regions 36, and openings for conductive features 74 may be formed through the second ILD 70 to the replacement gate structures to expose at least respective portions of the replacement gate structures. The openings may be formed using, for example, appropriate photolithography and etch processes. The openings for the conductive features 72 and 74 may be formed simultaneously or by using different photolithography and etch processes.

An adhesion layer can be conformally deposited in the openings, such as on the epitaxy source/drain regions 36 and sidewalls of the second ILD 70, first ILD 40, and ESL 38 for the conductive features 72, and such as on the gate electrodes 48 and sidewalls of the second ILD 70 for the conductive features 74. A barrier layer can be conformally deposited on the adhesion layer, for example. The adhesion layer may be or comprise, for example, titanium, cobalt, nickel, the like or a combination thereof, and may be deposited by ALD, CVD, or another deposition technique. The barrier layer may be or comprise titanium nitride, titanium oxide, tantalum nitride, tantalum oxide, the like, or a combination thereof, and may be deposited by ALD, CVD, or another deposition technique. Silicide regions may be formed on upper portions of the epitaxy source/drain regions 36 by reacting upper portions of the epitaxy source/drain regions 36 with the adhesion layer and/or barrier layer. An anneal can be performed to facilitate the reaction of the epitaxy source/drain regions 36 with the adhesion layer and/or barrier layer.

Conductive material filling the openings and on the barrier layer can then be formed. The conductive material may be or comprise tungsten, copper, aluminum, gold, silver, alloys thereof, the like, or a combination thereof, and may be deposited by CVD, ALD, PVD, or another deposition technique. After the conductive material is deposited, excess conductive material, barrier layer, and adhesion layer may be removed by using a planarization process, such as a CMP, for example. The planarization process may remove excess conductive material, barrier layer, and adhesion layer from above the top surface of the second ILD 70. Hence, top surfaces of the conductive material, barrier layer, adhesion layer, and second ILD 70 may be coplanar. Accordingly, conductive features 72 and 74 each including the conductive material, barrier layer, adhesion layer, and/or silicide regions may be formed to the epitaxy source/drain regions 36 and gate electrodes 48, respectively. The layout of the conductive features 72 and 74 in the figures is merely an example. A person having ordinary skill in the art will readily understand that a layout of conductive features can differ between different implementations.

Figure 19:
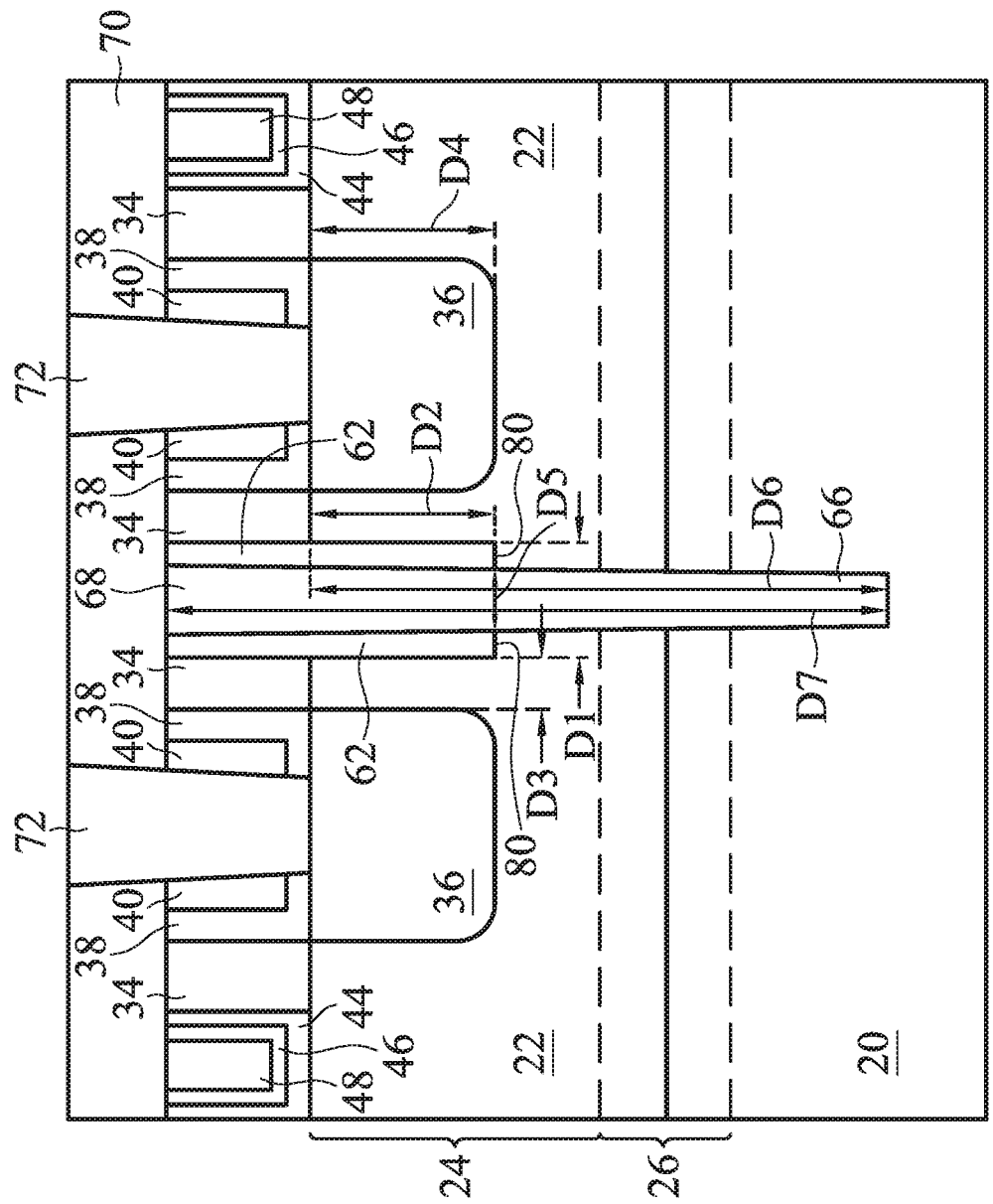
FIG. 19 is a portion of the cross-sectional view of the intermediate structure of FIG. 18B in accordance with some embodiments.

FIG. 19 illustrates a portion of the cross-sectional view of the intermediate structure of FIG. 18B, in accordance with some embodiments. FIG. 19 further illustrates step regions 80 at sidewalls of the cut fins 24 where the fin 24 was cut. The step regions 80 are formed by the trimming of the fin 24, the formation of the liner 62 along sidewalls of the fin 24 where trimmed, and the cutting of the fin 24 between the liner 62. Each step region 80 is formed by a first vertical sidewall of the respective cut fin 24 formed by the trimming, a horizontal surface of the respective cut fin 24 on which the liner 62 is formed, and a second vertical sidewall of the respective cut fin 24 formed by the cutting. The first vertical sidewall and horizontal sidewall are at respective interfaces between the cut fin 24 and the liner 62. The second vertical sidewall is at an interface between the cut fin 24 and the fill material 66.

The opposing first vertical sidewalls of the cut fins 24 formed by the trimming are a first dimension D1 apart. The horizontal surfaces of the cut fins 24 that are also formed by the trimming and on which the liner 62 is formed are a second dimension D2 from a top surface of the respective cut fin 24. The first dimension D1 and the second dimension D2 are dimensions of the trim cut 61 formed by the trimming. The first dimension D1 can be in a range from about 12 nm to about 20 nm, and the second dimension D2 can be in a range from about 20 nm to about 80 nm. An aspect ratio of the trimming (e.g., the second dimension D2 to the first dimension D1) can be in a range from about 2 to about 6.

The respective first vertical sidewalls of the cut fins 24 are a third dimension D3 from a corresponding epitaxy source/drain region 36. A crystalline material of the respective cut fin 24 is disposed within this third dimension D3. The third dimension D3 can be in a range from about 1 nm to about 5 nm.

The epitaxy source/drain regions 36 can extend into the cut fins 24 from a top surface of the respective cut fin 24 a fourth dimension D4. The fourth dimension D4 can be a depth that a recess is formed into the fin 24 for forming the epitaxy source/drain regions 36. The fourth dimension D4 can be in a range from about 0 nm to about 80 nm. The fourth dimension D4 is less than or equal to the second dimension D2; although in other examples, the fourth dimension D4 can be greater than the second dimension D2.

A fifth dimension D5 of the fill material 66 is between facing sidewalls of the liner 62. The fifth dimension D5 can be in a range from about 2 nm to about 18 nm. The fifth dimension D5 is less than the first dimension D1, such as by two times a thickness of the liner 62, which thickness can be in a range from about 1 nm to about 5 nm. A ratio of the fifth dimension D5 to the first dimension D1 can be in a range from about 0.2 to about 0.9. The fill material 66 can have a sixth dimension D6 from a top surface of the cut fins 24 to a bottom surface of the fill material 66. The sixth dimension D6 can be in a range from about 50 nm to about 200 nm. The fill material 66 can have a seventh dimension D7 from a top surface of the fill material 66 to the bottom surface of the fill material 66. The seventh dimension D7 can be in a range from about 80 nm to about 250 nm. An aspect ratio of the seventh dimension D7 to the fifth dimension D5 is in a range from about 10 to about 40.

Some embodiments may achieve advantages. With the liner deposited on sidewalls of a fin after trimming the fin, an epitaxy source/drain region can be better protected during a subsequent cutting process. The liner also can increase a cut window while providing improved protection to the epitaxy source/drain region. Further, crystalline material disposed between the fin cut-fill structure and the epitaxy source/drain region can act as a buffer and can help prevent relaxation of stress from the channel in the fin. This can help maintain stress more uniformly in the fin, and can permit more uniformity of device performance of devices formed with the fin. Other advantages may be achieved.

An embodiment is a structure. The structure includes a first fin and a second fin on a substrate, and a fin cut-fill structure disposed between the first fin and the second fin. The first fin and the second fin are longitudinally aligned. The fin cut-fill structure includes a liner on a first sidewall of the first fin, and an insulating fill material on a first sidewall of the liner and on a second sidewall of the first fin. The liner is further on a surface of the first fin between the first sidewall of the first fin and the second sidewall of the first fin.

Another embodiment is a method. A fin on a substrate is trimmed. A liner is formed along respective first sidewalls of a first section and a second section of the fin. The first sidewalls of the first section and the second section of the fin are formed by trimming the fin. The fin is cut through the liner. A fill material is formed along the liner and where the fin was cut.

A further embodiment is a method. A fin on a substrate is etched to form a trim cut. The trim cut defines a first sidewall and a second sidewall of the fin. A liner is formed along the first sidewall and the second sidewall of the fin. A bottom surface of the trim cut is exposed through the liner. The fin is etched through the bottom surface of the trim cut to form a fin cut. The fin cut is filled with an insulating material. The insulating material is along the liner.

A yet further embodiment is a method. A gate structure is removed from over a fin. The fin protrudes from a substrate. Removing the gate structure defines a region. The fin is trimmed in the region where the gate structure was removed. A liner is conformally deposited in the region where the gate structure was removed and on the trimmed fin. The liner is anisotropically etched. The trimmed fin is cut through the liner. An insulating material is disposed in the region where the gate structure was removed and where the trimmed fin was cut.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   trimming a fin on a substrate, wherein trimming the fin comprises etching the fin to a level above top surfaces of neighboring isolation regions on the substrate, the fin protruding from between the neighboring isolation regions;
   forming a liner along respective first sidewalls of a first section and a second section of the fin, the first sidewalls of the first section and the second section of the fin being formed by trimming the fin;
   cutting the fin through the liner; and
   forming a fill material along the liner and where the fin was cut.

2. The method of claim 1, wherein forming the liner comprises:
   conformally depositing a layer of the liner along the first sidewalls of the first section and the second section of the fin and along a lateral surface of the fin between the first sidewalls of the first section and the second section of the fin; and
   anisotropically etching the layer of the liner to remove the liner from at least a portion of the lateral surface of the fin between the first sidewalls of the first section and the second section of the fin.

3. The method of claim 1, wherein cutting the fin comprises etching the fin to a depth in the substrate below the fin.

4. The method of claim 1 further comprising epitaxially growing a source/drain region in the first section of the fin, the source/drain region being a nearest one to where the fin is cut, wherein after forming the liner along the first sidewall of the first section of the fin, a crystalline material of the fin is disposed laterally between the source/drain region and the liner.

5. The method of claim 1, wherein cutting the fin forms a first sub-fin and a second sub-fin, wherein a longitudinal axis of the first sub-fin is aligned with a longitudinal axis of the second sub-fin.

6. A method comprising:
   removing a gate structure from over a fin, the fin protruding from a substrate, removing the gate structure defining a region;
   trimming the fin in the region where the gate structure was removed;
   conformally depositing a liner in the region where the gate structure was removed and on the trimmed fin;
   anisotropically etching the liner;
   cutting the trimmed fin through the liner; and
   disposing an insulating material in the region where the gate structure was removed and where the trimmed fin was cut.

7. The method of claim 6, wherein the trimming the fin forms fin sidewalls on the fin defined by the region where the gate structure was removed.

8. The method of claim 7, wherein the insulating material is disposed on the liner along the fin sidewalls.

9. The method of claim 6, wherein:
   a first isolation region and a second isolation region are on the substrate and on opposing sides of the fin;
   a top surface of the trimmed fin in the region where the gate structure was removed is at a level at or above a top surface of the first isolation region; and
   cutting the trimmed fin cuts to a depth in the substrate at a level below a bottom surface of the first isolation region.

10. The method of claim 6, wherein the region where the gate structure was removed is between a first gate spacer and a second gate spacer, and further between a first gate cut-fill structure and a second gate cut-fill structure, the first gate spacer and the second gate spacer being over the fin, the first gate spacer and the second gate spacer each being disposed between the first gate cut-fill structure and the second gate cut-fill structure.

11. The method of claim 10, wherein:
   the trimming the fin forms a first fin sidewall on the fin and a second fin sidewall on the fin, the first fin sidewall being aligned with a sidewall of the first gate spacer, the second fin sidewall being aligned with a sidewall of the second gate spacer; and
   the insulating material is disposed on the liner along the first fin sidewall and along the second fin sidewall.

12. The method of claim 10, wherein the insulating material is disposed on the liner disposed along respective sidewalls of the first gate spacer, the second gate spacer, the first gate cut-fill structure, and the second gate cut-fill structure.

13. A method comprising:
   forming a first fin, a second fin, and a third fin protruding from a substrate, each of the first fin, the second fin, and the third fin having isolation regions along opposing sides;
   forming a gate structure over the first fin, the second fin, and the third fin;
   forming a first recess in the gate structure between the first fin and the second fin, and forming a second recess in the gate structure between the second fin and the third fin;
   filling the first recess and the second recess with a first dielectric material to form a first gate cut-fill structure and a second gate cut-fill structure, respectively;
   removing the gate structure interposed between the first gate cut-fill structure and the second gate cut-fill structure to form a third recess;
   forming a liner along sidewalls of the first gate cut-fill structure and the second gate cut-fill structure, wherein the second fin is exposed;
   recessing the second fin to form a fin recess; and
   filling the third recess and the fin recess with a second dielectric material.

14. The method of claim 13, wherein forming the liner comprises:
- depositing a liner layer over an upper surface of the gate structure, along the sidewalls of the first gate cut-fill structure and the second gate cut-fill structure, and over the second fin; and
- anisotropically etching the liner layer to remove the liner layer from over the upper surface of the gate structure and over the second fin.

15. The method of claim 14 further comprising, after removing the gate structure to form the third recess and prior to forming the liner, trimming the second fin.

16. The method of 14, wherein removing the gate structure interposed between the first gate cut-fill structure and the second gate cut-fill structure to form the third recess comprises:
- forming a patterned mask, the patterned mask exposing the gate structure interposed between the first gate cut-fill structure and the second gate cut-fill structure; and
- etching the gate structure using an isotropic etch process.

17. The method of claim 16, wherein the patterned mask completely covers the first gate cut-fill structure and the second gate cut-fill structure.

18. The method of claim 17, wherein the third recess extends under the patterned mask.

19. The method of claim 18, wherein the liner extends along an underside of the patterned mask.

20. The method of claim 19, wherein the liner extends horizontally along a surface of the isolation regions towards the second fin.

* * * * *